(12) United States Patent
Oyama et al.

(10) Patent No.: US 11,974,402 B2
(45) Date of Patent: Apr. 30, 2024

(54) COMPONENT SUPPLY DEVICE

(71) Applicant: YAMAHA HATSUDOKI KABUSHIKI KAISHA, Iwata (JP)

(72) Inventors: Kazuyoshi Oyama, Shizuoka (JP); Ryouta Masuda, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 775 days.

(21) Appl. No.: 17/056,392

(22) PCT Filed: Jun. 27, 2018

(86) PCT No.: PCT/JP2018/024463
§ 371 (c)(1),
(2) Date: Nov. 17, 2020

(87) PCT Pub. No.: WO2020/003424
PCT Pub. Date: Jan. 2, 2020

(65) Prior Publication Data
US 2021/0337709 A1 Oct. 28, 2021

(51) Int. Cl.
*H05K 13/04* (2006.01)
*B65H 37/00* (2006.01)

(52) U.S. Cl.
CPC ....... *H05K 13/0419* (2018.08); *B65H 37/002* (2013.01)

(58) Field of Classification Search
CPC ............. H05K 13/086; H05K 13/0417; H05K 13/0419; B65H 37/002
See application file for complete search history.

(56) References Cited

U.S. PATENT DOCUMENTS 5,873,691 A * 2/1999 Asai ................... H05K 13/0417
156/767
2011/0220755 A1 9/2011 Goh et al.
(Continued)

FOREIGN PATENT DOCUMENTS

CN 1993035 A 7/2007
CN 104025732 A 9/2014
(Continued)

OTHER PUBLICATIONS

An Office Action mailed by China National Intellectual Property Administration dated Apr. 23, 2021, which corresponds to Chinese Patent Application No. 201880093424.3 and is related to U.S. Appl. No. 17/056,392; with English language translation.
(Continued)

*Primary Examiner* — Sang K Kim
(74) *Attorney, Agent, or Firm* — Studebaker & Brackett PC

(57) ABSTRACT

A component supply device includes a reel placement portion capable of supporting a plurality of reels each on which a component supply tape is wound, and a feeder configured to feed the component supply tape toward a component supply position. The reel placement portion includes a first reel placement portion and a second reel placement portion including a first support configured to support an outer peripheral portion of a reel. The second reel placement portion is configured to change a position of the first support with respect to the feeder so as to change a distance between the feeder and the first support.

19 Claims, 9 Drawing Sheets

(56) References Cited

U.S. PATENT DOCUMENTS

| | | | |
|---|---|---|---|
| 2017/0034969 A1 | 2/2017 | Eguchi et al. | |
| 2017/0142873 A1* | 5/2017 | Ohashi | H05K 13/0417 |
| 2017/0354070 A1* | 12/2017 | Kobayashi | H05K 13/086 |

FOREIGN PATENT DOCUMENTS

| CN | 204104292 U | 1/2015 |
|---|---|---|
| CN | 205052065 U | 2/2016 |
| CN | 105848825 A | 8/2016 |
| CN | 106376228 A | 2/2017 |
| CN | 106385792 A | 2/2017 |
| CN | 106605459 A | 4/2017 |
| CN | 107432108 A | 12/2017 |
| CN | 107615905 A | 1/2018 |
| CN | 107710902 A | 2/2018 |
| JP | 2010-212681 A | 9/2010 |
| JP | 2013-046024 A | 3/2013 |
| JP | 2014-082249 A | 5/2014 |
| JP | 2017-199832 A | 11/2017 |
| WO | 2013/065460 A1 | 5/2013 |
| WO | 2016/002085 A1 | 1/2016 |
| WO | 2017/109891 A1 | 6/2017 |

OTHER PUBLICATIONS

An Office Action; "Notice of Reasons for Refusal," mailed by the Japanese Patent Office dated Dec. 7, 2021, which corresponds to Japanese Patent Application No. 2020-526794 and is related to U.S. Appl. No. 17/056,392 with English translation.

International Search Report issued in PCT/JP2018/024463; dated Sep. 11, 2018.

Written Opinion issued in PCT/JP2018/024463; dated Sep. 11, 2018.

* cited by examiner

COMPONENT SUPPLY DEVICE

CROSS-REFERENCE TO RELATED APPLICATION

This application is a National Stage of International Patent Application No. PCT/JP2018/024463, filed Jun. 27, 2018, the entire content of which is incorporated herein by reference.

BACKGROUND

Technical Field

The present disclosure relates to a component supply device, and more particularly, it relates to a component supply device including a reel placement portion that can support a plurality of reels on which component supply tapes are wound.

Background Art

Conventionally, a component supply device including a reel placement portion that can support a plurality of reels on which component supply tapes are wound is known. Such a component supply device is disclosed in International Publication No. 2016/002085, for example.

International Publication No. 2016/002085 discloses a tape feeder (component supply device) including a reel holder (reel placement portion) that can support a plurality of reels on which component supply tapes are wound, and a feeder main body that feeds the component supply tapes held by the reel holder toward a component supply position. In this tape feeder, the reel holder is configured to engage engaging pins with rotating shaft holes of the reels and rotatably hold the reels. Furthermore, in this tape feeder, the reel holder is configured to be movable in a direction away from the feeder main body such that the feeder main body and an adjacent reel do not interfere at the time of inserting or removing an engaging pin or at the time of moving a reel when the reel held by the reel holder is replaced.

SUMMARY

In the tape feeder (component supply device) disclosed in International Publication No. 2016/002085, the reel holder is moved in the direction away from the feeder main body such that the feeder main body and the adjacent reel do not interfere at the time of inserting or removing the engaging pin or at the time of moving the reel when the reel held by the reel holder is replaced. Therefore, when the engaging pin is inserted into or removed from the rotating shaft hole of the reel, it is necessary to largely move the reel holder with respect to the feeder main body in order for the engaging pin not to interfere with the adjacent reel. That is, it is necessary to largely move a rotating shaft of the reel to be replaced to a position at which the rotating shaft does not overlap the adjacent reel as viewed in the rotation axis direction of the reel and pull the reel out. Therefore, it is disadvantageously necessary to ensure a large arrangement area for the reel holder due to large movement of the reel holder.

Accordingly, the present disclosure provides a component supply device capable of significantly reducing or preventing an increase in an area ensured for a reel placement portion that can support a plurality of reels on which component supply tapes are wound.

In view of the above, a component supply device according to an aspect of the present disclosure includes a reel placement portion capable of supporting a plurality of reels each on which a component supply tape that has held components to be mounted on a substrate is wound, and a feeder configured to feed, toward a component supply position, the component supply tape of each of the reels placed on the reel placement portion. The reel placement portion includes a first reel placement portion configured to allow a reel that first supplies the component supply tape to the feeder among the plurality of reels to be arranged therein, and a second reel placement portion including a first support configured to support an outer peripheral portion of a reel that supplies the component supply tape to the feeder subsequent to the reel arranged in the first reel placement portion among the plurality of reels. The second reel placement portion is configured to change a position of the first support with respect to the feeder so as to change a distance between the feeder and the first support.

The component supply device according to this aspect of the present disclosure is configured as described above such that the outer peripheral portion of the reel can be supported by the first support of the second reel placement portion, and thus it is not necessary to support a rotation shaft of the reel. Therefore, when the reel is moved, it is not necessary to insert and remove the rotation shaft in a rotation axis direction to move the reel. Thus, it is not necessary to largely move the rotation shaft of the reel to be replaced to a position at which it does not overlap with an adjacent reel and pull the reel out as viewed in the rotation axis direction of the reel. That is, the reel placement portion is only required to be moved with respect to the feeder by a distance that enables the reel to move between the feeder and the reel placement portion. Consequently, it is not necessary to ensure a region for largely moving the second reel placement portion, and thus an increase in a region ensured for the reel placement portion capable of supporting the plurality of reels each on which the component supply tape is wound can be significantly reduced or prevented. Furthermore, the position of the first support with respect to the feeder is changed such that the distance between the feeder and the first support can be increased, and thus the reel can be easily moved from the second reel placement portion without interfering with the feeder. In addition, when the reel is not replaced, the distance between the feeder and the first support is reduced such that the second reel placement portion can be brought closer to the feeder, and thus the arrangement region of the reel placement portion can be reduced.

In the aforementioned component supply device according to this aspect, the second reel placement portion is preferably configured to be movable, with respect to the feeder, to a first position at which the distance between the first support and the feeder is equal to or more than a diameter of each of the reels and to a second position at which the distance between the first support and the feeder is less than the diameter of each of the reels. Accordingly, in a state in which the second reel placement portion is located at the first position, the reel of the second reel placement portion can be moved through between the feeder and the first support. Furthermore, in a state in which the second reel placement portion is located at the second position, the second reel placement portion can be brought closer to the feeder, and thus the arrangement region of the reel placement portion can be effectively reduced.

In this case, the reel arranged in the second reel placement portion is preferably configured to be movable to the first reel placement portion by passing through between the first support and the feeder in a state in which the component supply tape is supplied to the feeder and in a state in which the second reel placement portion is arranged at the first position. Accordingly, the reel arranged in the second reel placement portion can be easily moved to the first reel placement portion while a state in which the component supply tape is supplied to the feeder is maintained. Consequently, the reel arranged in the reel placement portion can be more easily replaced.

In the aforementioned component supply device according to this aspect, the second reel placement portion is preferably configured to be movable with respect to the first reel placement portion along a plane perpendicular to rotation axis directions of the reels. Accordingly, the reel is moved along the plane perpendicular to the rotation axis directions of the reels such that the reel can be replaced, and thus it is not necessary to move the reel placement portion or the rotation shaft in the rotation axis directions of the reels. Thus, the reels can be easily moved even when the reels are adjacent to each other in the rotation axis directions.

In this case, the second reel placement portion is preferably configured to rotate downward with respect to the first reel placement portion such that the distance between the feeder and the first support is increased. Accordingly, unlike a case in which the second reel placement portion is moved in a horizontal direction away from the feeder, a movement range in the horizontal direction can be reduced, and thus an increase in a space ensured for the component supply device can be significantly reduced or prevented.

In the aforementioned structure in which the second reel placement portion rotates downward with respect to the first reel placement portion, the second reel placement portion is preferably configured to move in a direction away from the feeder along a horizontal direction with respect to the first reel placement portion and rotate downward with respect to the first reel placement portion such that the distance between the feeder and the first support is increased. Accordingly, the second reel placement portion is moved in combination with the horizontal and downward rotational movement such that the distance between the feeder and the first support can be effectively increased. Furthermore, the second reel placement portion is spaced apart from the feeder such that the component supply tape can be pulled out from the reel. Thus, the component supply tape can be loosened when the reel is moved, and thus the reel can be moved more easily.

The aforementioned component supply device according to this aspect is preferably configured such that the reel arranged in the first reel placement portion passes under the first support of the second reel placement portion and is taken out from the first reel placement portion. Accordingly, the reel arranged in the first reel placement portion and supplying the component supply tape in advance can be taken out from below the second reel placement portion, and thus the reel of the first reel placement portion can be taken out without interfering with the reel of the second reel placement portion.

In the aforementioned component supply device according to this aspect, the first reel placement portion is preferably configured to not change its position with respect to the feeder when the component supply tape is supplied from the reel to the feeder. Accordingly, it is not necessary to provide a mechanism configured to move the first reel placement portion when the component supply tape is supplied, and thus a complex structure of the reel placement portion can be significantly reduced or prevented.

In the aforementioned component supply device according to this aspect, the first reel placement portion is preferably arranged on a reel holder provided in a feeder placement portion configured to allow the feeder to be arranged thereon, the reel holder being configured to hold the reel, and the reel arranged in the first reel placement portion preferably has an outer peripheral portion supported by a second support provided on the reel holder of the feeder placement portion. Accordingly, using the second support provided on the reel holder of the feeder placement portion, the outer peripheral portion of the reel of the first reel placement portion can be supported, and thus it is not necessary to separately provide a member configured to support the outer peripheral portion of the reel in the first reel placement portion.

In this case, the first reel placement portion of the reel placement portion is preferably configured to be supported by the second support of the reel placement portion, and the second reel placement portion of the reel placement portion is preferably configured to be movably supported by the first reel placement portion. Accordingly, using the second support provided on the reel holder of the feeder placement portion, the first reel placement portion and the second reel placement portion can be supported, and thus it is not necessary to separately provide a member configured to support the first reel placement portion.

In the aforementioned component supply device according to this aspect, the first reel placement portion preferably includes a pair of first plate-shaped members that face each other in rotation axis directions of the reels, the second reel placement portion preferably includes a pair of second plate-shaped members that face each other in the rotation axis directions of the reels, and the pair of second plate-shaped members are preferably configured to hold the first support therebetween, and to be movable with respect to the pair of first plate-shaped members along a direction in which the first plate-shaped members extend. Accordingly, the reels can be held by the first reel placement portion and the second reel placement portion while the pair of first plate-shaped members and the pair of second plate-shaped members partition the reels adjacent to each other in the rotation axis directions. Furthermore, the second plate-shaped members can be slid along the first plate-shaped members, and thus the second reel placement portion can be easily moved in the direction in which the first plate-shaped members extend.

In this case, the reel placement portion preferably includes guide side walls capable of guiding the reel continuously from the second reel placement portion to the first reel placement portion in a state in which the second reel placement portion is located at a position at which the distance between the first support and the feeder is equal to or more than a diameter of each of the reels, the guide side walls being defined by the pair of second plate-shaped members and the pair of first plate-shaped members. Accordingly, when the reel is moved from the second reel placement portion to the first reel placement portion, a state in which the reel is sandwiched between the pair of the second plate-shaped members and the pair of the first plate-shaped members can be maintained, and thus the reel can be more easily moved from the second reel placement portion to the first reel placement portion.

In the aforementioned structure in which the first reel placement portion includes the pair of first plate-shaped members, and the second reel placement portion includes the pair of second plate-shaped members, at least one of the pair of first plate-shaped members preferably includes a guide configured to guide movement of the pair of second plate-shaped members with respect to the pair of first plate-shaped members, and the pair of second plate-shaped members are preferably configured to be movable along the guide. Accordingly, the second plate-shaped members can be easily moved along the guide of the first plate-shaped members.

In this case, the guide preferably includes an elongated hole provided in the first plate-shaped member. Accordingly, a region in which the second plate-shaped members can be moved can be defined along the elongated hole, and thus movement of the second plate-shaped members to a position outside a predetermined range can be significantly reduced or prevented.

In the aforementioned structure in which the first plate-shaped members include the guide, the second reel placement portion is preferably configured to be horizontally movable and rotatable with respect to the first reel placement portion due to at least two guided members being guided with respect to the guide. Accordingly, the second reel placement portion can be stably supported by two or more guided members. Furthermore, when the second reel placement portion is rotated, one of the guided members is guided with the other of the guided members as a fulcrum such that the second reel placement portion can be easily rotated.

In the aforementioned structure in which the first reel placement portion includes the pair of first plate-shaped members, and the second reel placement portion includes the pair of second plate-shaped members, the pair of second plate-shaped members are preferably configured such that a distance between ends thereof farther from the feeder is larger than a distance between ends thereof closer to the feeder. Accordingly, the reel can be easily inserted from the side farther from the tape feeder, and thus the reel can be easily arranged in the second reel placement portion.

In the aforementioned structure in which the first reel placement portion includes the pair of first plate-shaped members, and the second reel placement portion includes the pair of second plate-shaped members, the pair of second plate-shaped members are preferably arranged inside the pair of first plate-shaped members. Accordingly, the movable second plate-shaped members can be arranged inside the first plate-shaped members, and thus interference of another member adjacent in the rotation axis directions of the reels with movement of the second plate-shaped members can be significantly reduced or prevented.

In the aforementioned structure in which the first reel placement portion includes the pair of first plate-shaped members, and the second reel placement portion includes the pair of second plate-shaped members, the second plate-shaped members each preferably have a thickness smaller than that of each of the first plate-shaped members. Accordingly, an increase in the width of the second reel placement portion in the rotation axis directions of the reels can be significantly reduced or prevented. Furthermore, the second plate-shaped members can be easily warped and deformed, and thus the second plate-shaped members are warped such that the distance between the pair of second plate-shaped members is increased. Thus, the reel can be easily arranged in the second reel placement portion.

In the aforementioned component supply device according to this aspect, the reel placement portion is preferably configured to be attachable to and detachable from a reel holder provided in a feeder placement portion configured to allow the feeder to be arranged thereon, the reel holder being configured to hold the reel. Accordingly, when the reel placement portion is not used, the component supply device can be used in a state in which the reel placement portion has been detached. Therefore, the arrangement region of the component supply device can be reduced by an amount corresponding to the detached reel placement portion.

In the aforementioned component supply device according to this aspect, the first reel placement portion and the second reel placement portion are preferably arranged at positions offset from the component supply position of the feeder in a plan view. Accordingly, a region below the component supply position can be left open, and thus a space for storing the used component supply tape and a space for another thing such as a space for the component mounting device can be ensured.

According to the present disclosure, as described above, it is possible to significantly reduce or prevent an increase in the area ensured for the reel placement portion that can support the plurality of reels on which the component supply tapes are wound.

DETAILED DESCRIPTION

An embodiment embodying the present disclosure is hereinafter described on the basis of the drawings.

Structure of Component Mounting Device

The structure of a component mounting device 100 including component supply devices 10 according to the embodiment of the present disclosure is described with reference to FIG. 1.

Figure 1:
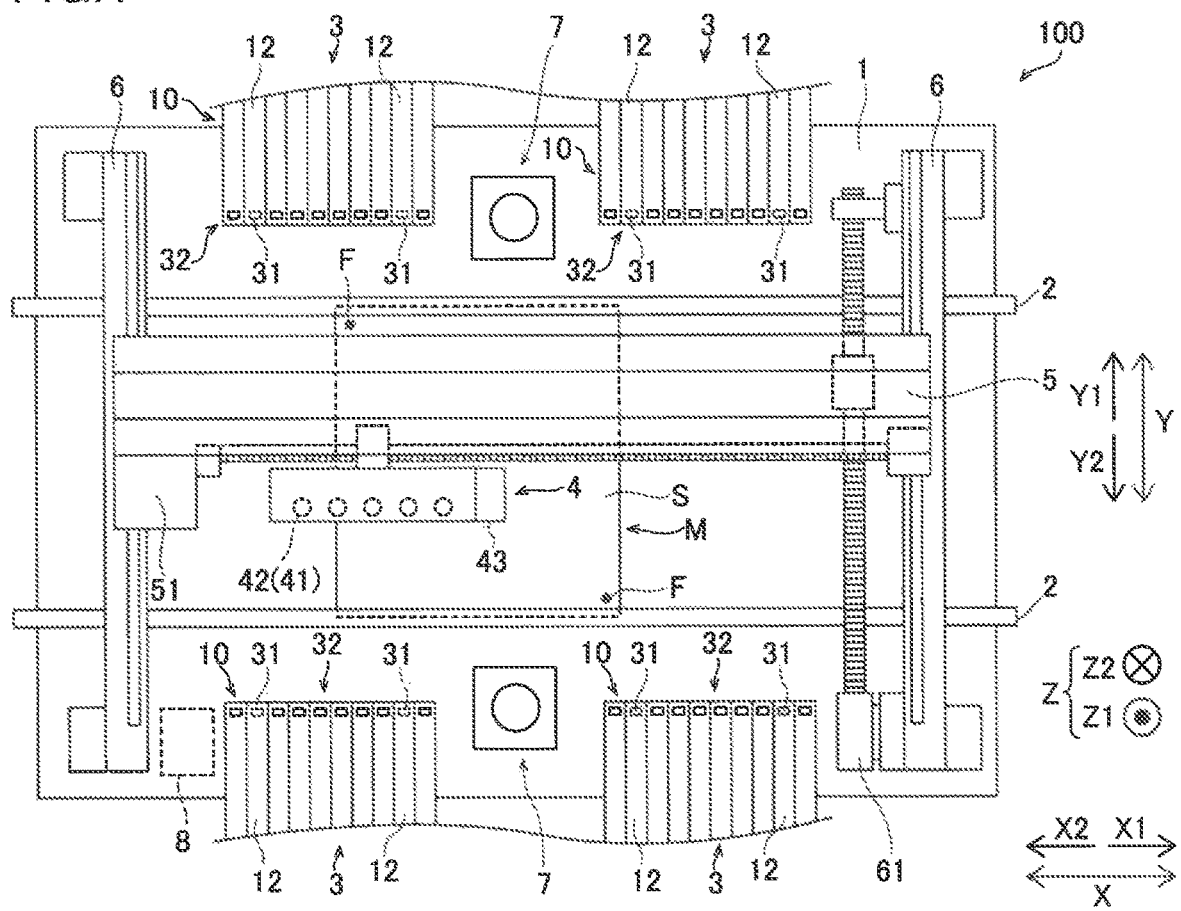
FIG. 1 is a plan view showing the structure of a component mounting device including component supply devices according to an embodiment of the present disclosure.

As shown in FIG. 1, the component mounting device 100 is a component mounting device that conveys a substrate S in an X direction by a pair of conveyors 2 and mounts components 31 on the substrate S at a mounting operation position M.

The component mounting device 100 includes a base 1, the pair of conveyors 2, component feeders 3, a head unit 4, a support 5, a pair of rails 6, component recognition imagers 7, and a controller 8.

The pair of conveyors 2 are installed on the base 1 and are configured to convey the substrate S in the X direction. In addition, the pair of conveyors 2 include a holding mechanism that holds the substrate S being conveyed in a stopped state at the mounting operation position M. Moreover, a distance between the pair of conveyors 2 in a Y direction can be adjusted according to the dimensions of the substrate S.

The component feeders 3 are arranged outside (Y1 and Y2 sides) of the pair of conveyors 2. The component supply devices 10 are provided in the component feeders 3. The component supply devices 10 of the component feeders 3 are configured to feed the components 31 to mounting heads 42 described below.

Figure 2:
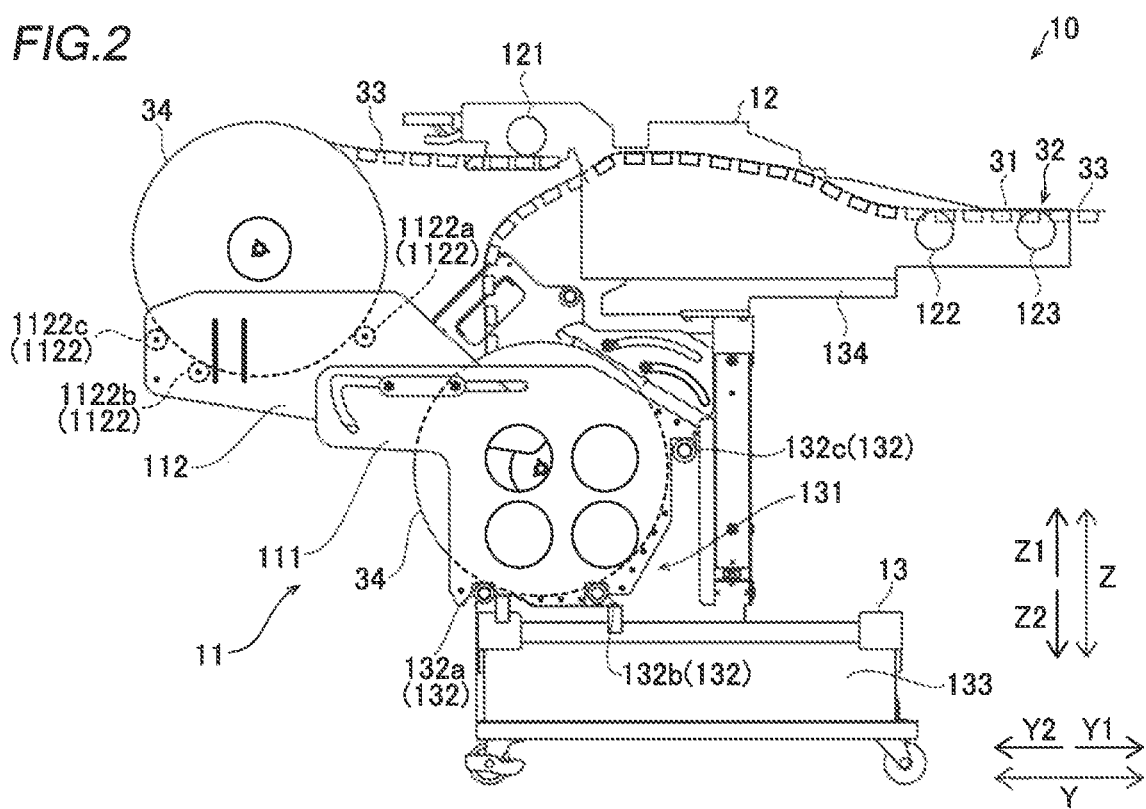
FIG. 2 is a side view showing a component supply device according to the embodiment of the present disclosure.

As shown in FIG. 2, the component supply devices 10 each hold reels 34 on which component supply tapes 33 that hold a plurality of components 31 at a predetermined interval are wound. The component supply device 10 includes reel placement portions 11, tape feeders 12, and a trolley 13. Each of the reel placement portions 11 can support a plurality of reels 34 on which the component supply tapes 33 that hold the components 31 to be mounted on the substrate S are wound. Each of the tape feeders 12 is configured to feed the component supply tapes 33 of the reels 34 placed on the reel placement portion 11 toward a component supply position 32. Each of the tape feeders 12 of the component supply device 10 is configured to supply the components 31 from the tip of the component supply device 10 in the Y direction. The components 31 include electronic components such as ICs, transistors, capacitors, resistors, and connectors. A plurality of reel placement portions 11 and a plurality of tape feeders 12 are arranged on the trolley 13. A detailed description of the component supply devices 10 is described below. The tape feeders 12 are examples of a "feeder" in the claims. The trolley 13 is an example of a "feeder placement portion" in the claims.

As shown in FIG. 1, the head unit 4 is arranged above the pair of conveyors 2 and the component feeders 3, and includes a plurality of (five) mounting heads 42 including nozzles 41 attached to their lower ends and a substrate recognition camera 43.

The mounting heads 42 are configured to mount the components 31 supplied from the component supply devices 10 on the substrate S. Specifically, the mounting heads 42 are configured to suction the components 31 supplied by the component supply devices 10 and to mount the suctioned components 31 on the substrate S arranged at the mounting operation position M. The mounting heads 42 are movable up and down (movable in a Z direction). Furthermore, the mounting heads 42 are configured to suction and hold the components 31 supplied from the component supply devices 10 by a negative pressure generated at the tips of the nozzles 41 by a negative pressure generator (not shown) and to mount the components 31 at mounting positions on the substrate S.

The substrate recognition camera 43 is configured to image fiducial marks F of the substrate S in order to recognize the position and the orientation of the substrate S. The positions of the fiducial marks F are imaged and recognized such that the mounting positions of the components 31 on the substrate S can be accurately acquired.

The support 5 includes a motor 51. The support 5 is configured to move the head unit 4 in the X direction along the support 5 by driving the motor 51. Opposite ends of the support 5 are supported by the pair of rails 6.

The pair of rails 6 are fixed on the base 1. A rail 6 on the X1 side includes a motor 61. The rails 6 are configured to move the support 5 in the Y direction orthogonal to the X direction along the pair of rails 6 by driving the motor 61. The head unit 4 is movable in the X direction along the support 5, and the support 5 is movable in the Y direction along the rails 6 such that the head unit 4 is movable in a horizontal direction (the X and Y directions).

The component recognition imagers 7 are fixed on the upper surface of the base 1. The component recognition imagers 7 are arranged outside (Y1 and Y2 sides) of the pair of conveyors 2. The component recognition imagers 7 are configured to image the components 31 suctioned by the nozzles 41 of the mounting heads 42 from below (Z2 side) in order to recognize the suction states (suction orientations) of the components 31 prior to mounting of the components 31. Thus, the suction states of the components 31 suctioned by the nozzles 41 of the mounting heads 42 can be acquired by the controller 8.

The controller 8 includes a CPU and a memory, and is configured to control the overall operation of the component mounting device 100 such as the substrate S conveying operation performed by the pair of conveyors 2, the mounting operation performed by the head unit 4, and the imaging operations performed by the component recognition imagers 7 and the substrate recognition camera 43. Moreover, the controller 8 is configured or programmed to be able to communicate with a controller (not shown) of each of the tape feeders 12. The controller 8 is configured or programmed to control the mounting operation in cooperation with the controller of each of the plurality of tape feeders 12.

Structure of Component Supply Device

The structure of each of the component supply devices 10 according to the embodiment of the present disclosure is now described with reference to FIGS. 2 to 15.

As shown in FIG. 2, the component supply device 10 includes the reel placement portions 11, the tape feeders 12, and the trolley 13. The reel placement portions 11 each include a first reel placement portion 111 and a second reel placement portion 112. The plurality of reels 34 are arranged in the reel placement portion 11. Specifically, a reel 34 that first supplies a component supply tape 33 to the tape feeder 12 is arranged in the first reel placement portion 111 of the reel placement portion 11. A reel 34 that supplies a component supply tape 33 to the tape feeder 12 subsequent to the reel 34 arranged in the first reel placement portion 111 is arranged in the second reel placement portion 112 of the reel placement portion 11. The reels 34 arranged in the reel placement portion 11 are large-diameter reels each having a relatively large diameter, for example. The diameter of each of the reels 34 is 13 inches or more. The diameter of each of the reels 34 is 13 inches, 15 inches, or 17 inches, for example. The width of each of the component supply tapes 33 wound on the reels 34 is 4 mm, 8 mm, 12 mm, or 16 mm, for example. Each of the component supply tapes 33 may have a wider width such as 72 mm or 104 mm.

The tape feeder 12 is a feeder capable of automatically loading the component supply tape 33. That is, the tape feeder 12 is configured to automatically switch the reels 34 such that the component supply tape 33 is supplied from the reel 34 arranged in the second reel placement portion 112 when the component supply tape 33 of the reel 34 arranged in the first reel placement portion 111 is completed, and to continue supply of the components 31. The tape feeder 12 includes an insertion-side sprocket 121, an intermediate sprocket 122, and a supply sprocket 123.

That is, the component supply tape 33 wound on the reel 34 arranged in the second reel placement portion 112 is on standby in a state in which the tip thereof is inserted from an insertion opening of the tape feeder 12, and a feed hole of the tip is fitted to a teeth of the insertion-side sprocket 121. In that state, when the absence of the components 31 supplied by the component supply tape 33 unwound from the reel 34 of the first reel placement portion 111 is detected, the insertion-side sprocket 121 starts rotating, the subsequent component supply tape 33 is fed in a downstream direction, and automatic loading is started. The insertion-side sprocket 121 can be a tape loading device that automatically conveys the inserted component supply tape 33 to the component supply position 32. The component supply tape 33 inserted from the insertion opening of the tape feeder 12 is fitted to the teeth of the insertion-side sprocket 121 from below in a state in which the component supply tape 33 is placed on a support member from below and is supported. The intermediate sprocket 122 and the supply sprocket 123 are arranged in the downstream direction. The component supply tape 33 is fitted to these sprockets (the intermediate sprocket 122 and the supply sprocket 123) and is fed from upstream to downstream by rotation of these sprockets. When the component supply tape 33 is fed to the downstream sprockets (the intermediate sprocket 122 and the supply sprocket 123), a drive source of the insertion-side sprocket 121 may stop rotating or may rotate in synchronization with the supply sprocket 123. When the drive source of the insertion-side sprocket 121 stops rotating, a one-way clutch that allows only the rotation of the insertion-side sprocket 121 in a tape feed direction is only required to be provided. The component supply position 32 is preferably provided in the vicinity of the supply sprocket 123. The intermediate sprocket 122 may not be provided. An exposure mechanism that exposes upper portions of storages from a cover tape of the component supply tape 33 is arranged at any position between the insertion-side sprocket 121 and the supply sprocket 123. After the first component 31 reaches the component supply position 32 by the automatic loading of the component supply tape 33, the supply sprocket 123 intermittently feeds the component supply tape 33 to supply the components 31. Every time feeding of the component supply tape 33 is intermittently stopped, the mounting heads 42 take out the components 31 at the component supply position 32. The supply sprocket 123 can be assumed to be a component supply and conveyance device that conveys the component supply tape 33 to supply the components 31.

Thus, presetting can be performed to move the reel 34 of the second reel placement portion 112 to the first reel placement portion 111 in a state in which the component supply tape 33 is fitted to the supply sprocket 123, arrange a reel 34 of a new subsequent component supply tape 33 in the second reel placement portion 112, and insert the subsequent component supply tape 33 through the insertion opening of the tape feeder 12. As described above, the inserted component supply tape 33 waits in a state in which it can be moved downstream by driving of the insertion-side sprocket 121, but in this state, the insertion-side sprocket 121 has stopped rotating. Furthermore, before the subsequent component supply tape 33 is inserted into a position at which the subsequent component supply tape 33 is fitted to the insertion-side sprocket 121, a preceding component supply tape 33 is unsupported by the support member (not shown) described above and is spaced apart downward from the insertion-side sprocket 121. Even when the preceding component supply tape 33 is detached from the insertion-side sprocket 121, the component supply tape 33 is intermittently fed by driving of the supply sprocket 123 to supply the components 31.

That is, when the component supply tape 33 of the reel 34 arranged in the first reel placement portion 111 is completed and automatic switching is performed such that the component supply tape 33 is supplied from the reel 34 arranged in the second reel placement portion 112, an operator removes the empty reel 34 from the first reel placement portion 111. Then, the reel 34 that is supplying the components 31 in the second reel placement portion 112 is moved from the second reel placement portion 112 to the first reel placement portion 111. Furthermore, a subsequent reel 34 is set in the second reel placement portion 112. A reel replacement operation as described above is repeated every time the supply of the components 31 from the reel 34 of the first reel placement portion 111 is completed such that it is possible to continuously supply the components 31 without cutting off the supply of the components 31. The reel replacement operation as described above can be performed at the timing convenient for the operator before the components 31 of the reel 34 arranged in the second reel placement portion 112 are run out, and thus an increase in operator labor for the reel replacement operation can be significantly reduced or prevented.

The plurality of reel placement portions 11 and the plurality of tape feeders 12 can be arranged on the trolley 13. The trolley 13 includes a reel holder 131 that holds the reels 34, supports 132 provided on the reel holder 131, a tape box 133, and a placement portion 134. As shown in FIG. 2, the supports 132 include supports 132a, 132b, and 132c. The supports 132 extend in a direction (X direction) in which a plurality of reels 34 are arranged. The supports 132 are configured to rotatably support the reels 34. The supports 132 include rotatable rollers. That is, the outer peripheral portions of the reels 34 are supported by the supports 132. That is, the rotatable rollers (supports 132) contact the outer peripheries of the reels 34. The support 132a is arranged on the lower side in a Y2 direction. The support 132b is arranged in a Y1 direction with respect to the support 132a. The support 132c is arranged above the support 132b in the Y1 direction. The trolley 13 includes casters, and is configured to be movable with respect to the component mounting device 100 while holding the plurality of tape feeders 12. The supports 132 are examples of a "second support" in the claims.

The tape feeders 12 are detachably arranged in the placement portion 134. That is, each of the plurality of tape feeders 12 is attachable to and detachable from the trolley 13. Thus, the tape feeders 12 corresponding to the reels 34 of the components 31 to be supplied can be arranged on the trolley 13.

The first reel placement portions 111 of the reel placement portions 11 are supported by the supports 132 of the trolley 13. Furthermore, the second reel placement portions 112 of the reel placement portions 11 are movably supported by the first reel placement portions 111. That is, the reel placement portions 11 are hooked on the supports 132 of the trolley 13 and installed. Furthermore, the first reel placement portions 111 are arranged on the reel holder 131 provided in the trolley 13 on which the tape feeders 12 are arranged and configured to hold the reels 34. The outer peripheral portions of the reels 34 arranged in the first reel placement portions 111 are supported by the supports 132 provided on the reel holder 131 of the trolley 13.

With the above structure, the reel placement portions 11 are attachable to and detachable from the trolley 13, and the reels 34 can be supported by the supports 132 and placed even when the reel placement portions 11 are not present. Furthermore, with the above structure, the tape feeders 12 are attachable to and detachable from the trolley 13. Therefore, the tape feeders 12, each of which uses two reels 34, causes one of the two reels 34 to wait, and automatically loads the subsequent component supply tape 33 on standby when the components of the preceding component supply tape 33 are run out, as shown in FIG. 2, can be arranged on the trolley 13. Furthermore, tape feeders, each of which uses only one reel 34 without using a reel 34 on standby and supplies components 31 stored in a component supply tape 33, can also be arranged on the trolley 13. In this case, a reel placement portion 11 can be detached, and the reel 34 can be placed on the trolley 13. However, even with the reel placement portion 11 attached to the trolley 13, the tape feeder 12 that uses only one reel 34 can be arranged and used on the trolley 13. As shown in FIG. 1, a plurality of tape feeders can be aligned in the X direction on the trolley 13. Therefore, the tape feeders 12 using the two reels 34 shown in FIG. 2 and the tape feeders using only one reel 34 can be arranged in a mixed manner on the trolley 13. In this case, it is only required to place the reel placement portions 11 only in locations in which the tape feeders 12 shown in FIG. 2 are placed.

The tape box 133 is arranged below the reel placement portions 11. The tape box 133 is configured to be pulled out in a front direction (a direction away from the component mounting device 100). Furthermore, the tape box 133 is configured to house the component supply tapes 33 that have finished supplying the components 31. That is, the tape box 133 can be pulled out toward the front without interfering with the reel placement portions 11, and the component supply tapes 33 inside the tape box 133 can be taken out and discarded in a state in which the tape box 133 is pulled out.

The reel placement portions 11 are attachable to and detachable from the reel holder 131 provided in the trolley 13 on which the tape feeders 12 are arranged and configured to hold the reels 34. That is, the reel placement portions 11 can be detached from the trolley 13 according to the sizes of the reels 34 and the frequency of use of the reels 34. Furthermore, the first reel placement portions 111 are configured to not change their positions with respect to the tape feeders 12 when the component supply tapes 33 are supplied from the reels 34 to the tape feeders 12. That is, the first reel placement portions 111 are configured not to move when the components 31 are supplied to the component mounting device 100.

The component supply tapes 33 each include a carrier tape and a cover tape. The carrier tape includes storages in which the components 31 are stored and engaging holes for engaging with the sprockets of the tape feeder 12. The storages have spaces larger than the sizes of the components 31. The upper portions of the storages are covered with the cover tape. When the components are supplied, the cover tape is cut open by the exposure mechanism such that the upper portions of the storages are exposed. Thus, at the component supply position 32, the components 31 can be taken out from the storages by the mounting heads 42. The exposure mechanism may be configured not only to cut open the cover tape but also to peel off and expose only one side of the cover tape at the storages.

Figure 3:
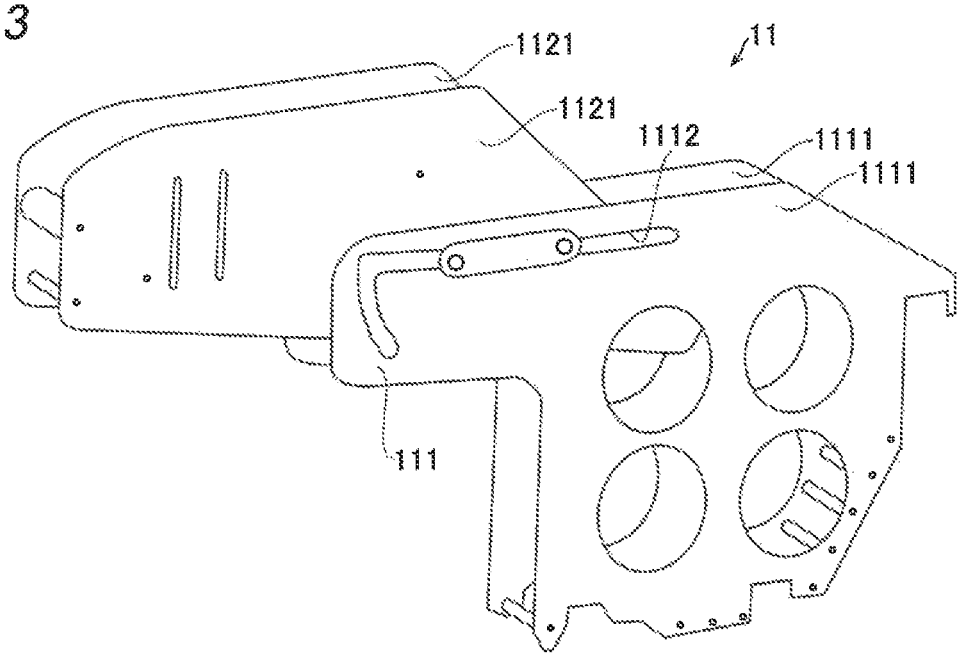
FIG. 3 is a perspective view showing a reel placement portion of the component supply device according to the embodiment of the present disclosure.
Figure 4:
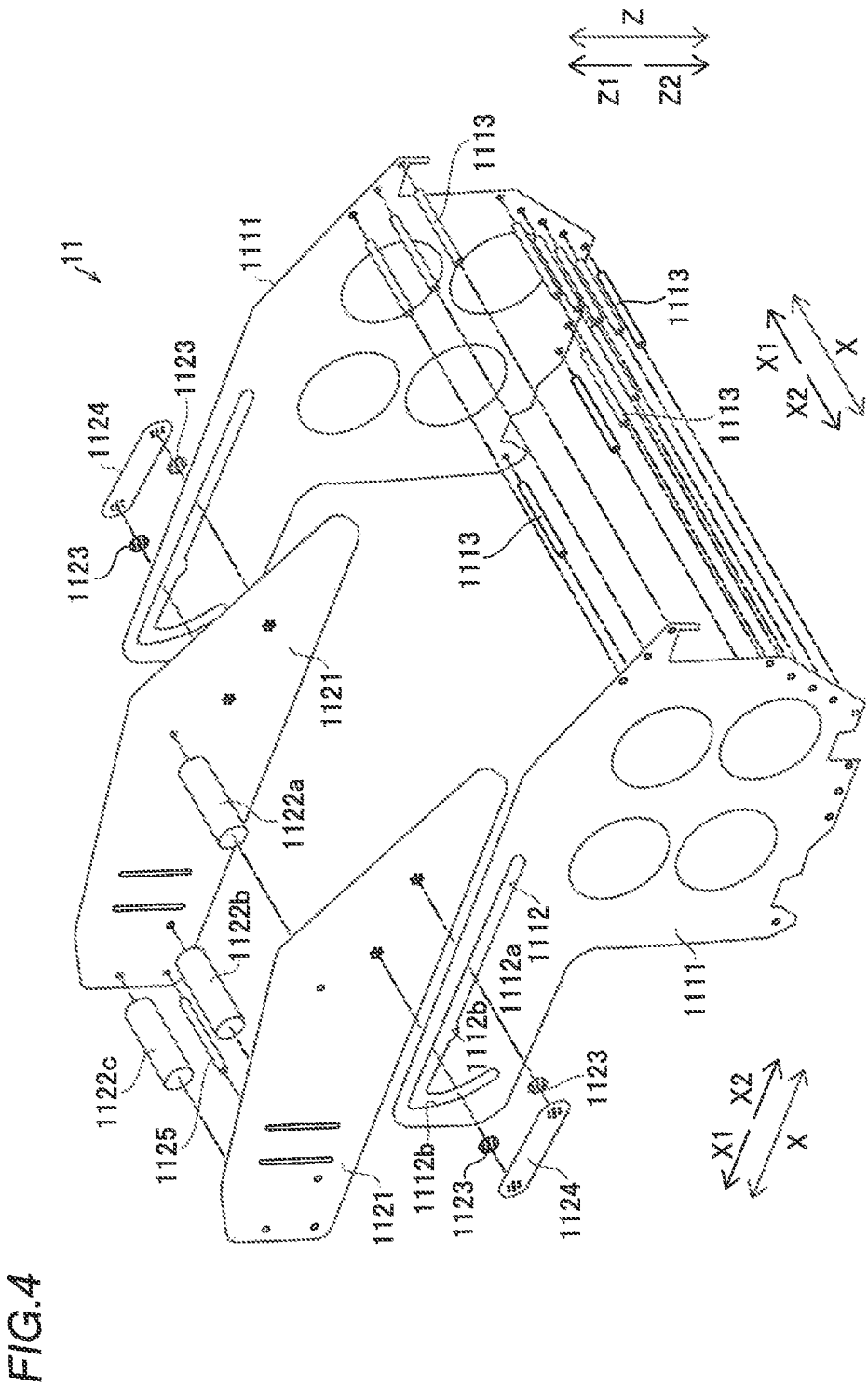
FIG. 4 is an exploded perspective view of the reel placement portion of the component supply device according to the embodiment of the present disclosure.

As shown in FIGS. 3 and 4, the first reel placement portion 111 of the reel placement portion 11 includes a pair of first plate-shaped members 1111, guides 1112, and connectors 1113. The guides 1112 each have a horizontal guide 1112*a*, a positioning portion 1112*b*, and a rotation guide 1112*c*. The second reel placement portion 112 of the reel placement portion 11 includes a pair of second plate-shaped members 1121, supports 1122 (1122*a*, 1122*b*, and 1122*c*), guided members 1123, connecting members 1124, and a connector 1125. The supports 1122 are examples of a "first support" in the claims.

The supports 1122 and the connector 1125 have an integral shape that connects the pair of second plate-shaped members 1121 so as to keep a distance between the pair of second plate-shaped members 1121 constant. Furthermore, the component supply tape 33 is unwound from the reel 34 placed on the supports 1122 and is inserted into the tape feeder 12. Therefore, even if the reel 34 is tried to be moved to the left side in FIG. 2, for example, and be moved to the first reel placement portion 111 through lower portions of the supports 1122, the component supply tape 33 remains on the supports 1122, and thus the reel 34 cannot be moved.

The pair of first plate-shaped members 1111 of the first reel placement portion 111 face each other in the rotation axis direction (X direction) of the reel 34. The pair of second plate-shaped members 1121 of the second reel placement portion 112 face each other in the rotation axis direction of the reel 34. The pair of second plate-shaped members 1121 are arranged inside the pair of first plate-shaped members 1111.

Figure 5:
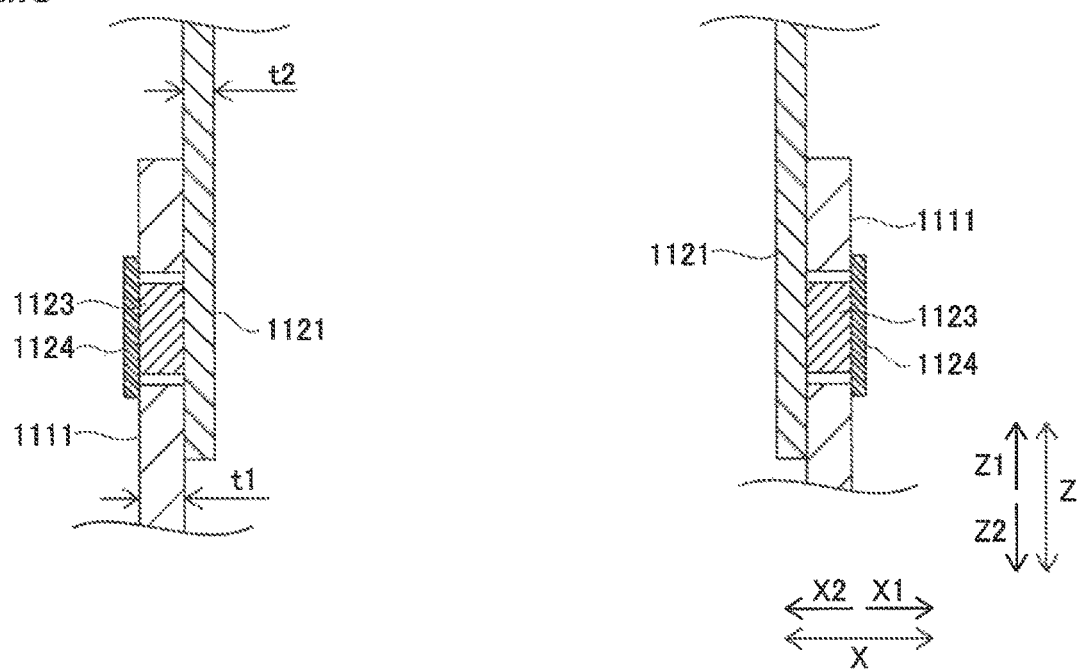
FIG. 5 is a diagram for illustrating a connection between a first reel placement portion and a second reel placement portion of the reel placement portion of the component supply device according to the embodiment of the present disclosure.

The pair of first plate-shaped members 1111 are connected at a predetermined interval by a plurality of connectors 1113. The pair of second plate-shaped members 1121 are connected at a predetermined interval by the supports 1122*a*, 1122*b*, and 1122*c* and the connector 1125. As shown in FIGS. 4 and 5, each connecting member 1124 and each second plate-shaped member 1121 are connected in a state in which two guided members 1123 are inserted into the guide 1112 of the first plate-shaped member 1111. Thus, the second plate-shaped members 1121 are movably supported with respect to the first plate-shaped members 1111. Furthermore, the supports 1122 are configured to rotatably support the reel 34. The supports 1122 include rotatable rollers.

The pair of second plate-shaped members 1121 are configured to sandwich and hold the supports 1122 and to be movable with respect to the pair of first plate-shaped members 1111 in a direction in which the first plate-shaped members 1111 extend.

The guides 1112 of the first plate-shaped members 1111 guide movement of the pair of second plate-shaped members 1121 with respect to the pair of first plate-shaped members 1111. Specifically, each of the guides 1112 includes an elongated hole provided in the first plate-shaped member 1111. That is, the second plate-shaped members 1121 are guided along the elongated holes and can move with respect to the first plate-shaped members 1111. Furthermore, at least two guided members 1123 are guided with respect to the guides 1112 such that the second reel placement portion 112 is horizontally movable and rotatable with respect to the first reel placement portion 111.

The horizontal guide 1112a of the guide 1112 guides movement of the second plate-shaped member 1121 in the horizontal direction (Y direction). In this case, both of the two guided members 1123 are located in the horizontal guide 1112a such that the horizontal orientation of the second plate-shaped member 1121 is maintained.

The positioning portion 1112b of the guide 1112 is configured to position the second plate-shaped member 1121 at a position during normal operation. Specifically, the positioning portion 1112b is provided in a halfway portion of the horizontal guide 1112a, and is recessed downward. Thus, a guided member 1123 on the Y2 direction side is fitted into the positioning portion 1112b such that the second plate-shaped member 1121 is positioned. When positioning of the second plate-shaped member 1121 is released, the second plate-shaped member 1121 is lifted upward such that the guided member 1123 comes out of the positioning portion 1112b. Thus, the second plate-shaped member 1121 can be moved along the horizontal guide 1112a.

The rotation guide 1112c of the guide 1112 guides rotation of the second plate-shaped member 1121 in an upward-downward direction. In this case, the guided member 1123 on the Y2 direction side is located in the rotation guide 1112c, and a guided member 1123 on the Y1 direction side is arranged in the horizontal guide 1112a on the Y1 direction side relative to the positioning portion 1112b.

The second plate-shaped member 1121 has a smaller thickness than the first plate-shaped member 1111. Specifically, the first plate-shaped member 1111 has a thickness of t1. For example, the first plate-shaped member 1111 is made of a metal material such as stainless steel and has a thickness of about 1.2 mm. The second plate-shaped member 1121 has a thickness of t2 (note that t2<t1). For example, the second plate-shaped member 1121 is made of a metal material such as stainless steel and has a thickness of about 0.8 mm. That is, the second plate-shaped member 1121 is more warped than the first plate-shaped member 1111. Furthermore, the first plate-shaped member 1111 has a higher mechanical strength than the second plate-shaped member 1121. The first plate-shaped member 1111 and the second plate-shaped member 1121 are formed by sheet-metal processing.

Figure 6:
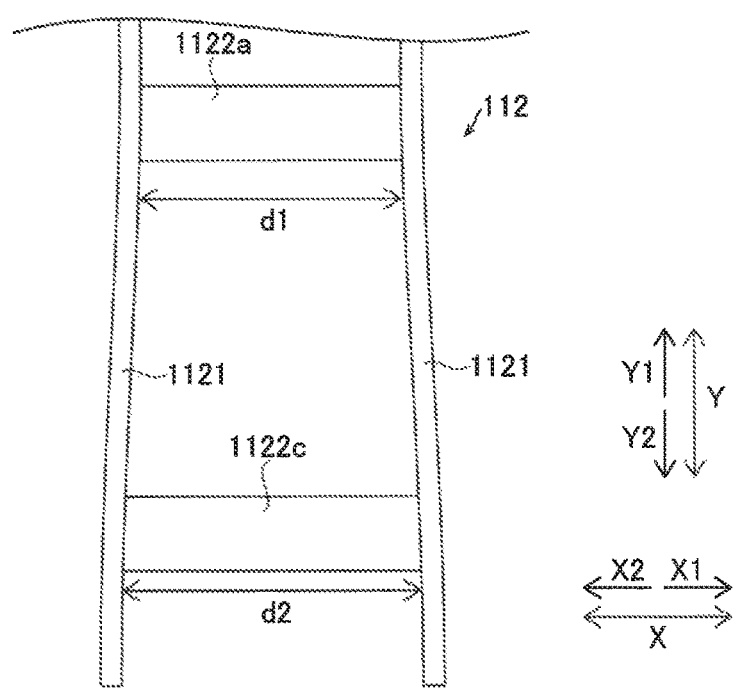
FIG. 6 is a diagram for illustrating the width of the reel placement portion of the component supply device according to the embodiment of the present disclosure.

As shown in FIG. 6, a distance between ends (ends on the Y2 direction side) of the pair of second plate-shaped members 1121 farther from the tape feeder 12 is larger than a distance between ends (ends on the Y1 direction side) of the pair of second plate-shaped members 1121 closer to the tape feeder 12. Specifically, the width of the support 1122a arranged on the Y1 direction side in the X direction is d1, and the width of the support 1122c arranged on the Y2 direction side in the X direction is d2 (note that d2>d1). Thus, the distance between the pair of second plate-shaped members 1121 on the Y2 direction side is increased.

Figure 7:
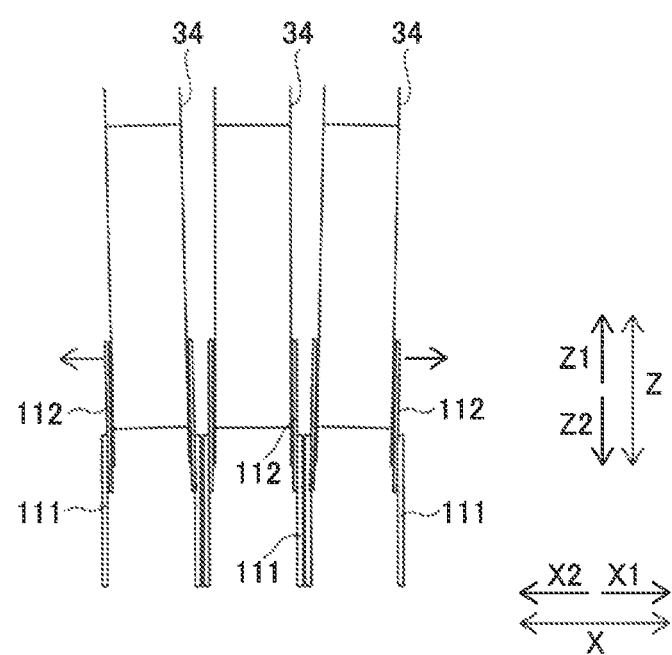
FIG. 7 is a diagram for illustrating the arrangement of reels in reel placement portions of the component supply device according to the embodiment of the present disclosure.

As shown in FIG. 7, when the reel placement portions 11 are arranged side by side in the X direction, the second plate-shaped members 1121 on both sides (the X1 direction side and the X2 direction side) of the reel placement portion 11 to be accessed for replacement of the reel 34 can be warped to be widened outward. That is, a region between the second plate-shaped members 1121 can be increased using the elasticity of the second plate-shaped members 1121. Thus, a space for replacement of the reel 34 can be ensured, and thus the reel 34 can be arranged closely in the rotation axis direction (X direction).

In the reel placement portion 11, guide side walls capable of guiding the reel 34 continuously from the second reel placement portion 112 to the first reel placement portion 111 in a state in which the second reel placement portion 112 is located at a position at which a distance between the support 1122 (1122a) and the tape feeder 12 is equal to or more than the diameter of the reel 34 are defined by the pair of second plate-shaped members 1121 and the pair of first plate-shaped members 1111.

In this embodiment, in the second reel placement portion 112, the position of the support 1122 (1122a) with respect to the tape feeder 12 is changed such that the distance between the tape feeder 12 and the support 1122 (1122a) is changed. Furthermore, the supports 1122 are configured to support the outer peripheral portion of the reel 34.

Figure 12:
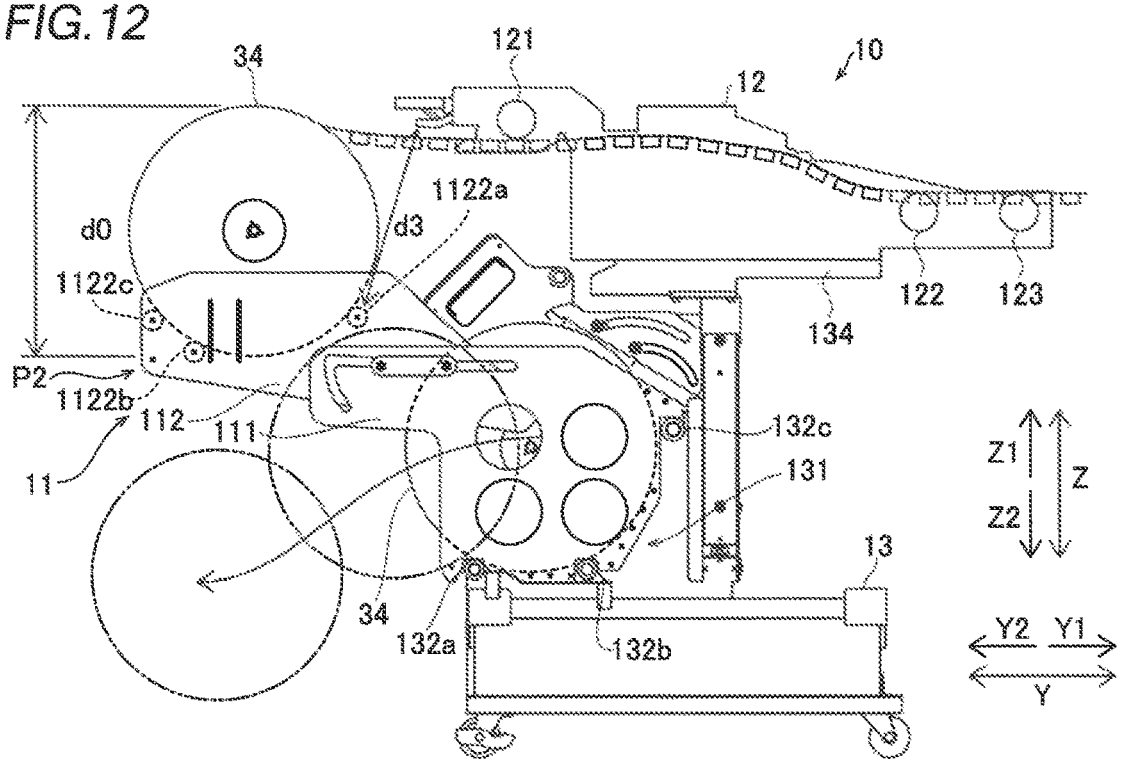
FIG. 12 is a diagram for illustrating removal of a reel in the component supply device according to the embodiment of the present disclosure.
Figure 14:
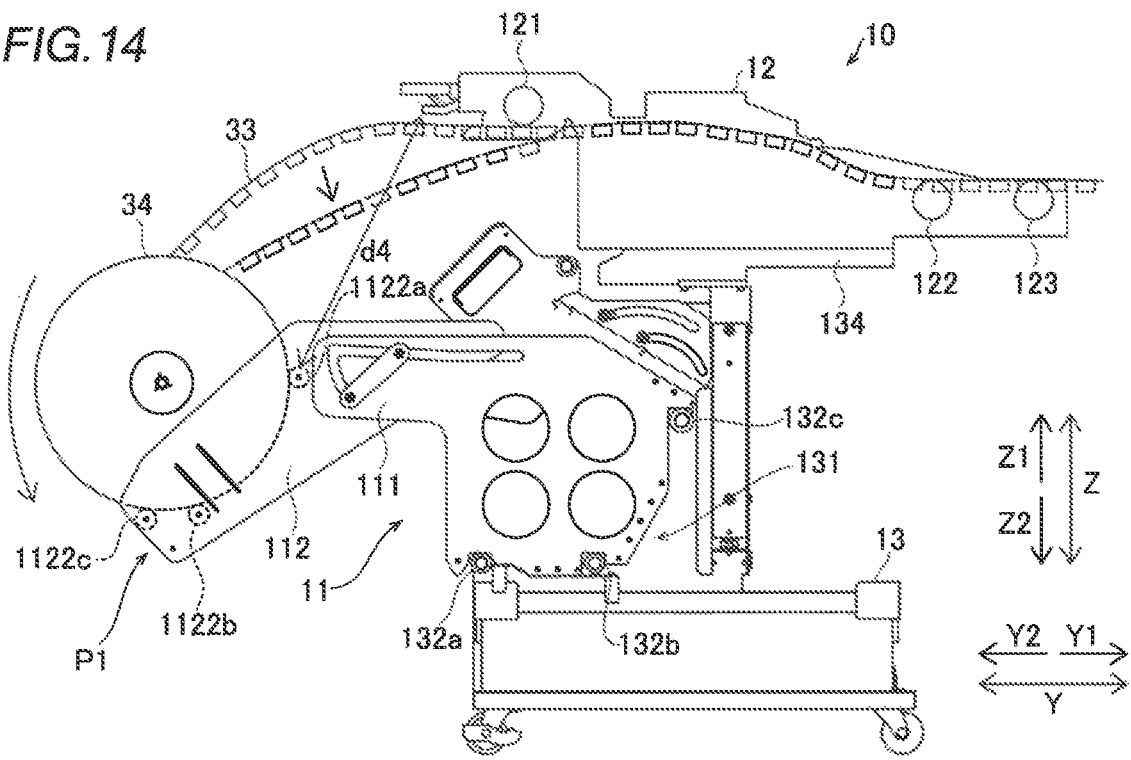
FIG. 14 is a diagram for illustrating rotation of the reel in the component supply device according to the embodiment of the present disclosure.

Specifically, the second reel placement portion 112 can be moved to a first position P1 at which the distance between the support 1122 (1122a) and the tape feeder 12 (i.e., a shortest distance among distances between constituent portions of the tape feeder 12 and the support 1122a and between constituent portions of the trolley 13 and the support 1122a) is equal to or more than the diameter d0 of the reel 34. As shown in FIG. 14, when the second reel placement portion 112 is located at the first position P1, the distance between the support 1122a and the tape feeder 12 is d4 (however, d4≥d0). Furthermore, the second reel placement portion 112 is configured to be movable with respect to the tape feeder 12 at a second position P2 at which the distance between the support 1122 (1122a) and the tape feeder 12 is less than the diameter d0 of the reel 34. As shown in FIG. 12, when the second reel placement portion 112 is located at the second position P2, the distance between the support 1122a and the tape feeder 12 is d3 (however, d3<d0).

Figure 15:
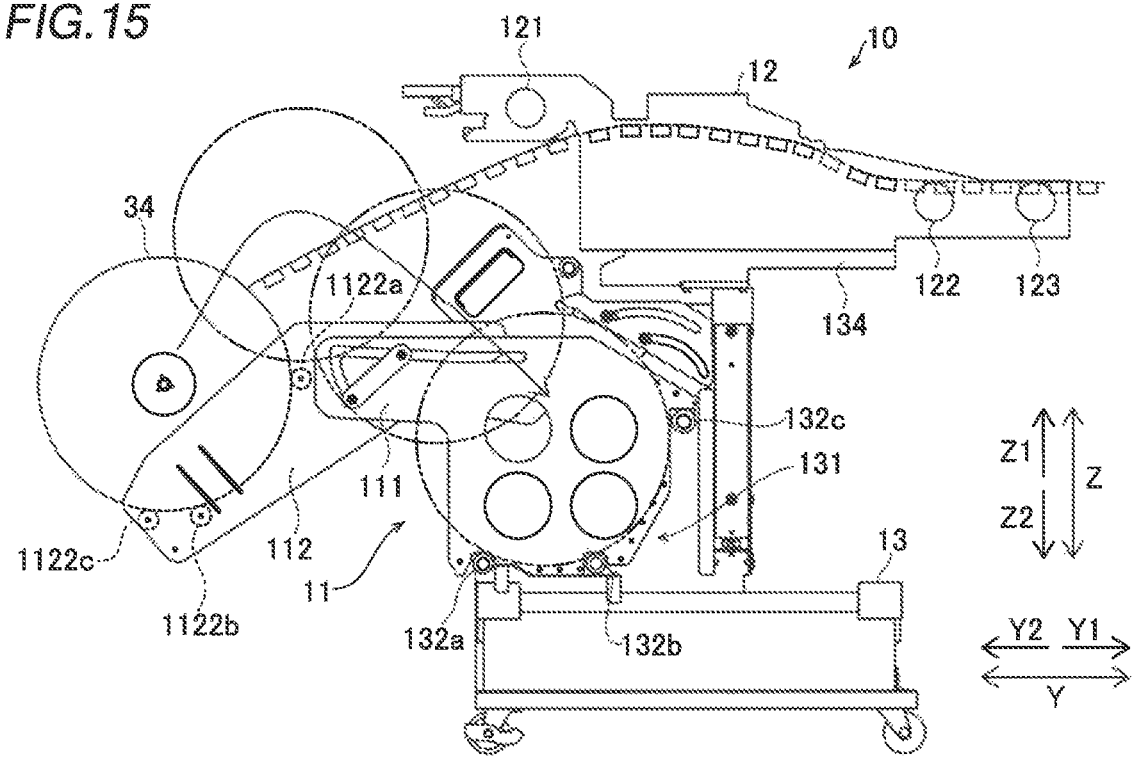
FIG. 15 is a diagram for illustrating movement of the reel in the component supply device according to the embodiment of the present disclosure.

As shown in FIG. 15, the reel 34 arranged in the second reel placement portion 112 can move to the first reel placement portion 111 by passing through between the support 1122 (1122a) and the tape feeder 12 in a state in which the component supply tape 33 is supplied to the tape feeder 12, and the second reel placement portion 112 is arranged at the first position P1. In the state shown in FIG. 15, the component supply tape 33 is detached downward from the insertion-side sprocket 121, and is intermittently conveyed only by the intermediate sprocket 122 and the supply sprocket 123 to supply the components 31.

As shown in FIGS. 8 to 11, the second reel placement portion 112 is configured to be movable with respect to the first reel placement portion 111 along a plane (YZ plane) perpendicular to the rotation axis direction of the reel 34. That is, even when a plurality of reels 34 are arranged side by side in the rotation axis directions (X direction) of the reels 34, the second reel placement portions 112 can be moved with respect to the first reel placement portions 111 without interfering with the first reel placement portions 111.

As shown in FIG. 12, the reel 34 arranged in the first reel placement portion 111 can pass under the support 1122

(1122a) of the second reel placement portion 112 and be taken out from the first reel placement portion 111. That is, even when a plurality of reels 34 are arranged side by side in the rotation axis directions (X direction) of the reels 34, the reels 34 can be taken out from the first reel placement portions 111 without interfering with the adjacent reel placement portions 11. In other words, for one reel placement portion 11, the reels 34 are moved in the Y and Z directions without requiring movement of the reels 34 in a width direction (X direction) such that the reels 34 can be replaced.

Figure 13:
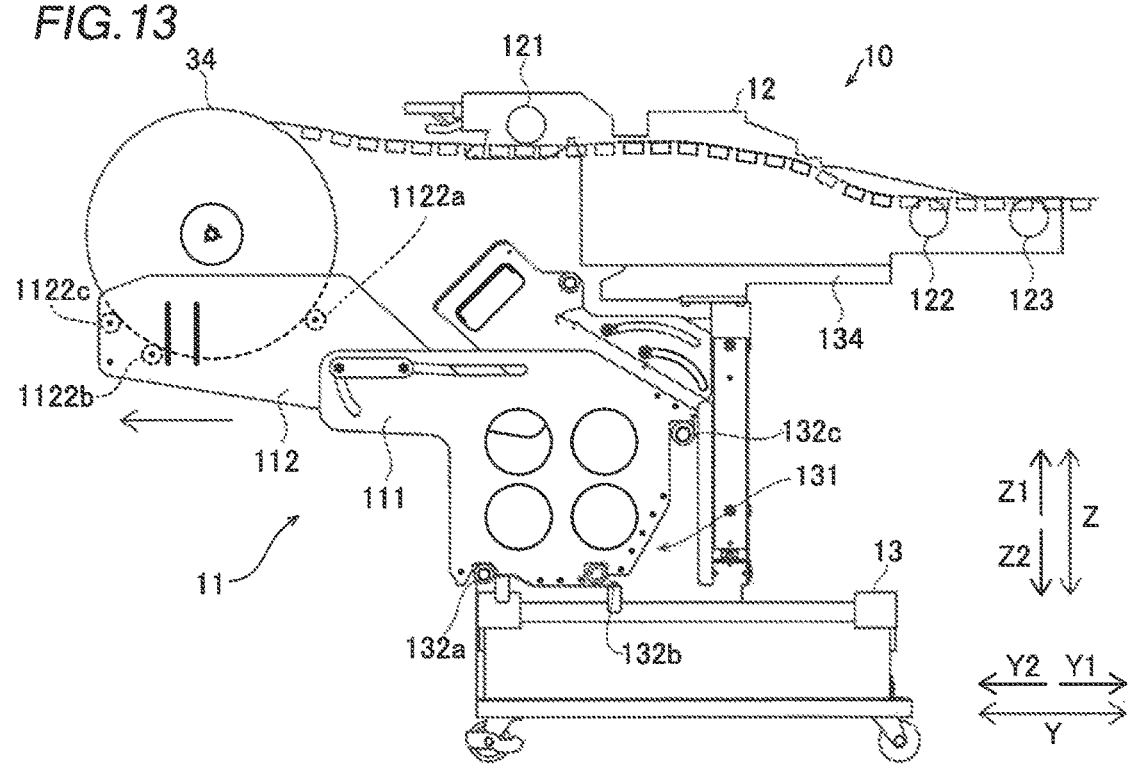
FIG. 13 is a diagram for illustrating pulling out of the reel in the component supply device according to the embodiment of the present disclosure.

As shown in FIG. 14, the second reel placement portion 112 rotates downward (in a Z2 direction) with respect to the first reel placement portion 111 such that the distance between the tape feeder 12 and the support 1122 (1122a) is increased. Specifically, as shown in FIGS. 12 to 14, the second reel placement portion 112 is configured to move in a direction away from the tape feeder 12 along the horizontal direction with respect to the first reel placement portion 111 and rotate downward with respect to the first reel placement portion 111 such that the distance between the tape feeder 12 and the support 1122 (1122a) is increased.

The first reel placement portion 111 and the second reel placement portion 112 are arranged at positions offset from the component supply position 32 of the tape feeder 12 in a plan view (as viewed in the Z direction). That is, the reel 34 is not arranged below the tape feeder 12 on the Y1 direction side. Thus, a space above the tape box 133 can be ensured.

Figure 8:
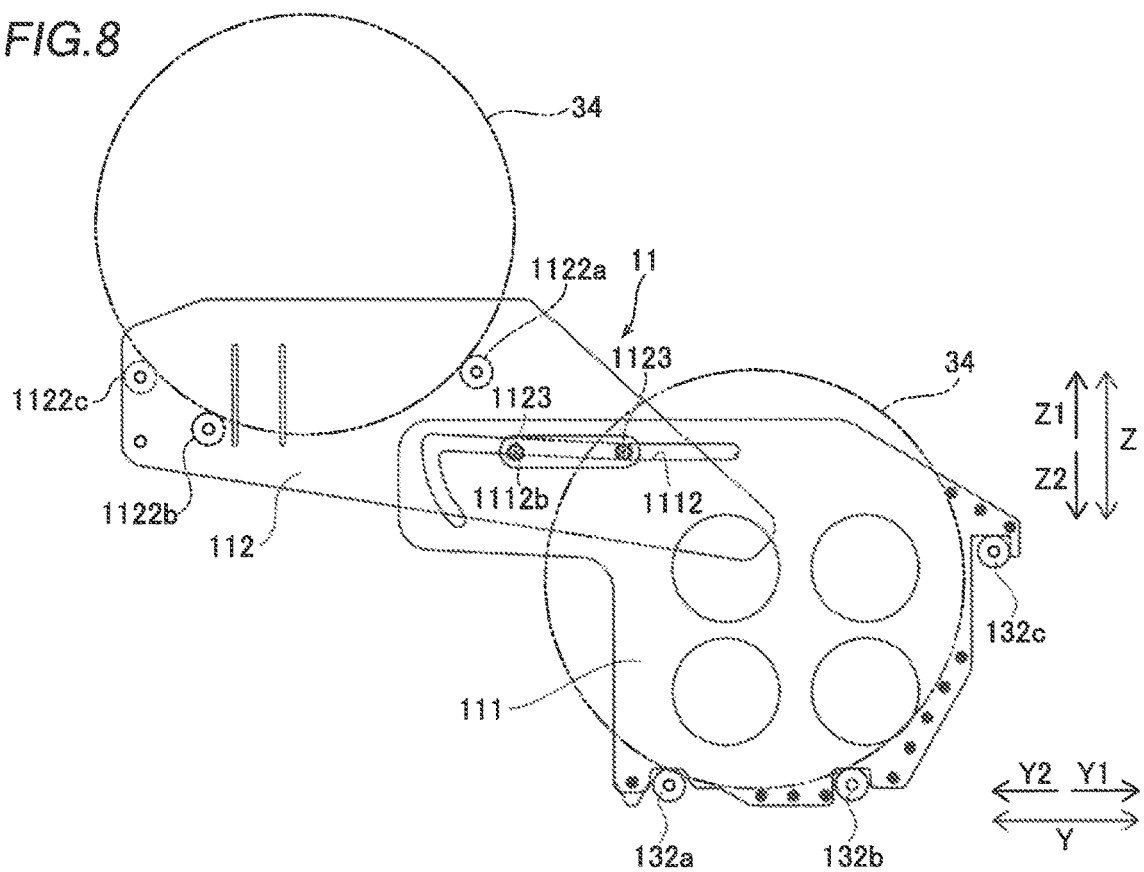
FIG. 8 is a diagram showing the position of the reel placement portion of the component supply device according to the embodiment of the present disclosure during normal operation.

As shown in FIG. 8, in the reel placement portion 11, the second reel placement portion 112 is arranged at a position at which one (on the Y2 direction side) of the guided members 1123 engages with the positioning portion 1112b of the guide 1112 during normal operation of the component mounting device 100. In this state, a distance between the support 1122a and the support 132a is equal to or more than the diameter d0 of the reel 34. At the position of the reel placement portion 11 during normal operation, a basic arrangement in which a preceding reel 34 is arranged in the first reel placement portion 111, and a subsequent preset reel 34 is arranged in the second reel placement portion 112 is formed. At this position, when the components 31 of the first reel placement portion 111 is run out, a space for taking out the empty reel 34 from the first reel placement portion 111 toward the front (in the Y2 direction) can be ensured. Furthermore, at this position, the preset reel 34 can be placed on the second reel placement portion 112.

Figure 9:
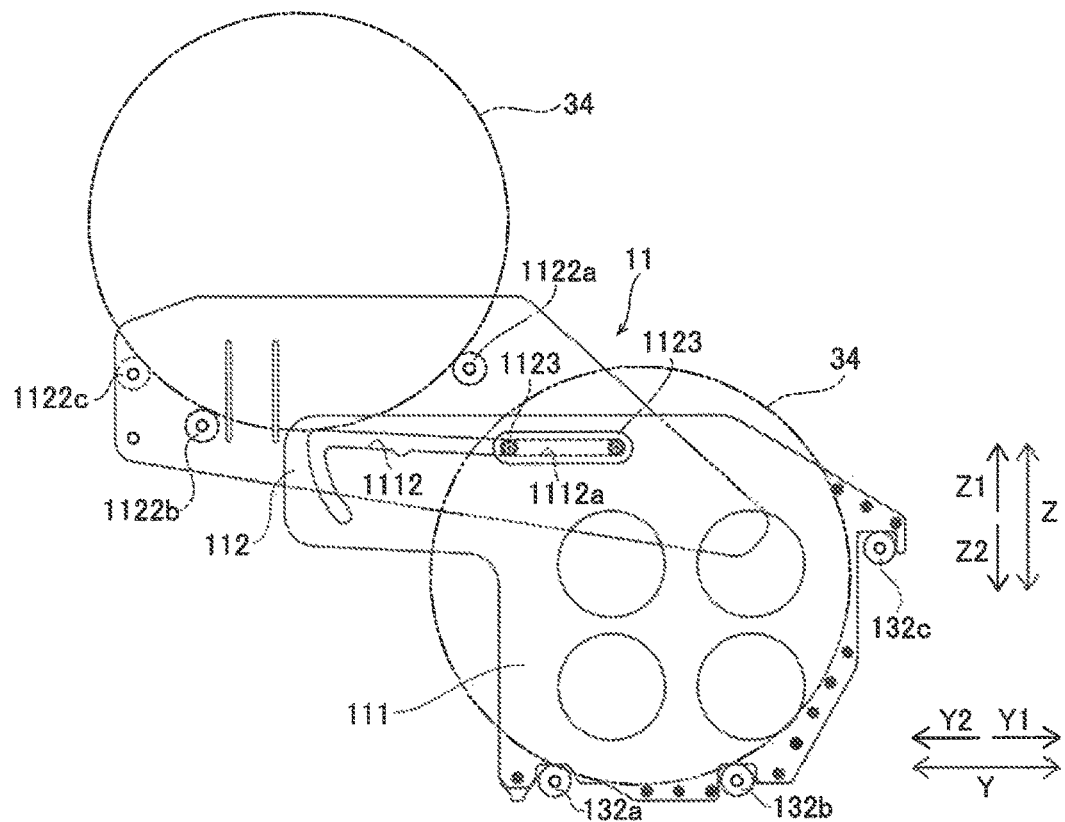
FIG. 9 is a diagram showing a storage position of the reel placement portion of the component supply device according to the embodiment of the present disclosure.

As shown in FIG. 9, when the second reel placement portion 112 is stored in the reel placement portion 11, the second reel placement portion 112 is arranged at a position at which the other (on the Y1 direction side) of the guided members 1123 contacts a Y1 direction side end of the horizontal guide 1112a of the guide 1112. In this state, the distance between the support 1122a and the support 132a is less than the diameter d0 of the reel 34. Needless to say, when the guided member 1123 is moved in the Y2 direction, the distance between the support 1122a and the support 132a can be equal to or more than the diameter d0 of the reel 34. The storage position of the reel placement portion 11 is a position at which the second reel placement portion 112 is stored when it is necessary to temporarily expand a front (on the Y2 direction side) space, such as when a workbench or the like is caused to pass through a passage between the equipment lines. Even at the position of the guided member 1123 shown in FIG. 9, the operation of the tape feeder 12 to feed the component supply tape 33 of the reel 34 arranged in the second reel placement portion 112 can be performed without any trouble. Furthermore, obstruction of the passage of the operator can be prevented. When the reel placement portion 11 is not in use, the second reel placement portion 112 is stored at the storage position such that the reel placement portion 11 can be made compact. However, at this storage position, when the preset reel 34 is set in the second reel placement portion 112, a work space for setting the component supply tape 33 in the tape feeder 12 is reduced. Therefore, when the reel 34 is preset in the second reel placement portion 112, it is preferable to perform the presetting at the position during normal operation.

Figure 10:
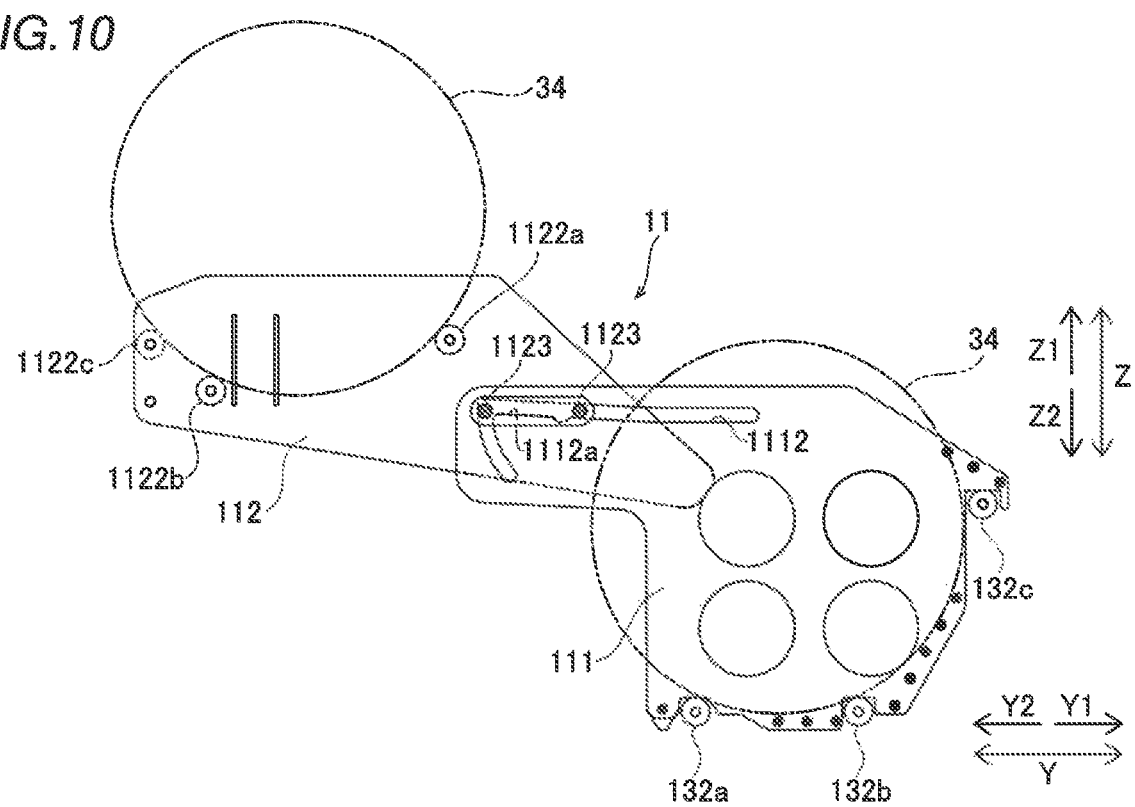
FIG. 10 is a diagram showing a pull-out position of the reel placement portion of the component supply device according to the embodiment of the present disclosure.

As shown in FIG. 10, in the reel placement portion 11, when the second reel placement portion 112 is pulled out, the second reel placement portion 112 is arranged at a position at which one (on the Y2 direction side) of the guided members 1123 contacts a Y2 direction side end of the horizontal guide 1112a of the guide 1112.

Figure 11:
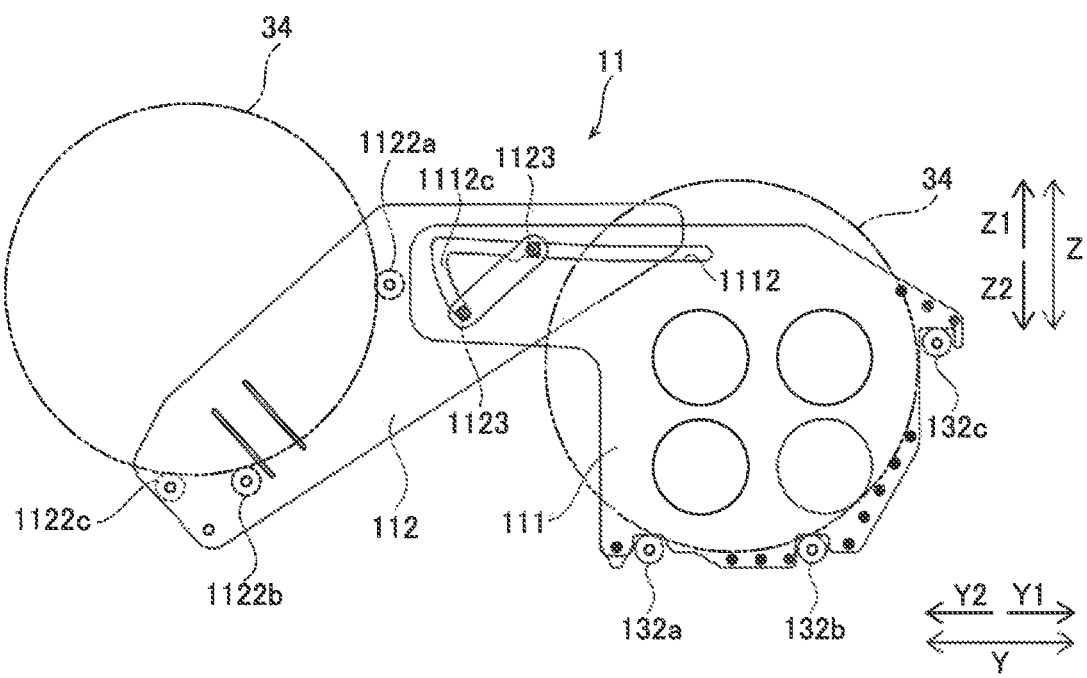
FIG. 11 is a diagram showing a rotation position of the reel placement portion of the component supply device according to the embodiment of the present disclosure.

As shown in FIG. 11, in the reel placement portion 11, when the second reel placement portion 112 is rotated, the second reel placement portion 112 is moved such that one (on the Y2 direction side) of the guided members 1123 is guided along the rotation guide 1112c of the guide 1112. In a state in which the second reel placement portion 112 is rotated downward, the support 1122c arranged on the Y2 direction side is arranged on the Y2 direction side with respect to the center of the reel 34. At a position at which the second reel placement portion 112 is rotated downward, a space (particularly an upper space) for moving the preset reel 34 from the second reel placement portion 112 to the first reel placement portion 111 after taking out the empty reel 34 from the first reel placement portion 111 is ensured. The second reel placement portion 112 is pulled out and rotated such that as compared with a case in which the second reel placement portion 112 is simply pulled out, the standing position of the operator can be closer to the tape feeder 12.

The replacement of the reel 34 of the reel placement portion 11 is now described with reference to FIGS. 12 to 15.

As shown in FIG. 12, when the components 31 (component supply tape 33) of the reel 34 of the first reel placement portion 111 are run out, the components 31 (component supply tape 33) are supplied from the reel 34 preset in the second reel placement portion 112. In a state in which the components 31 are supplied from the reel 34 of the second reel placement portion 112, the empty reel 34 is taken out from the first reel placement portion 111 by the operator in a direction of the arrow through the lower portions of the supports 1122a.

As shown in FIG. 13, the second reel placement portion 112 is pulled out in the direction (Y2 direction) away from the tape feeder 12. As shown in FIG. 14, the second reel placement portion 112 is rotated downward. Furthermore, the preset component supply tape 33 is lowered to the position of the preceding tape of the tape feeder 12 (tape dropping is performed). In this state, the component supply tape 33 of the second reel placement portion 112 is loosened to some extent by movement of the second reel placement portion 112, and thus the reel 34 can be easily moved. When the loosening is small, the component supply tape 33 may be pulled out from the reel 34 by the operator.

As shown in FIG. 15, the reel 34 is moved from the second reel placement portion 112 to the first reel placement portion 111. At this time, the components 31 (component supply tape 33) are continuously supplied to the tape feeder 12. Furthermore, the reel 34 is moved through between the support 1122a and the tape feeder 12. After that, as shown in FIG. 2, the second reel placement portion 112 is moved to the position during normal operation. Then, the subsequent preset reel 34 is arranged in the second reel placement portion 112.

Advantageous Effects of Embodiment

According to this embodiment, the following advantageous effects are achieved.

According to this embodiment, as described above, the outer peripheral portion of the reel 34 can be supported by the supports 1122 of the second reel placement portion 112, and thus it is not necessary to support a rotation shaft of the reel 34. Therefore, when the reel 34 is moved, it is not necessary to insert and remove the rotation shaft in the rotation axis direction (X direction) to move the reel 34. Thus, it is not necessary to largely move the rotation shaft of a replacement reel 34 to a position at which it does not overlap with the adjacent reel 34 and pull the reel 34 out as viewed in the rotation axis direction of the reel 34. That is, the reel placement portion 11 (second reel placement portion 112) is only required to be moved with respect to the tape feeder 12 by a distance that enables the reel 34 to move between the tape feeder 12 and the reel placement portion 11 (second reel placement portion 112). Consequently, it is not necessary to ensure a region for largely moving the second reel placement portion 112, and thus an increase in a region ensured for the reel placement portion 11 capable of supporting a plurality of reels 34 on which the component supply tapes 33 are wound can be significantly reduced or prevented. Furthermore, the position of the support 1122 with respect to the tape feeder 12 is changed such that the distance between the tape feeder 12 and the support 1122 (1122*a*) can be increased, and thus the reel 34 can be easily moved from the second reel placement portion 112 without interfering with the tape feeder 12. In addition, when the reel 34 is not replaced, the distance between the tape feeder 12 and the support 1122 is reduced such that the second reel placement portion 112 can be brought closer to the tape feeder 12, and thus the arrangement region of the reel placement portion 11 can be reduced.

According to this embodiment, as described above, the second reel placement portion 112 is configured to be movable with respect to the tape feeder 12 to the first position P1 at which the distance between the support 1122 (1122*a*) and the tape feeder 12 is equal to or more than the diameter of the reel 34 and to the second position P2 at which the distance between the support 1122 (1122*a*) and the tape feeder 12 is less than the diameter of the reel 34. Accordingly, in a state in which the second reel placement portion 112 is located at the first position P1, the reel 34 of the second reel placement portion 112 can be moved through between the tape feeder 12 and the support 1122 (1122*a*). Furthermore, in a state in which the second reel placement portion 112 is located at the second position P2, the second reel placement portion 112 can be brought closer to the tape feeder 12, and thus the arrangement region of the reel placement portion 11 can be effectively reduced.

According to this embodiment, as described above, the reel 34 arranged in the second reel placement portion 112 can move to the first reel placement portion 111 by passing through between the support 1122 (1122*a*) and the tape feeder 12 in a state in which the component supply tape 33 is supplied to the tape feeder 12, and the second reel placement portion 112 is arranged at the first position P1. Accordingly, the reel 34 arranged in the second reel placement portion 112 can be easily moved to the first reel placement portion 111 while a state in which the component supply tape 33 is supplied to the tape feeder 12 is maintained. Consequently, the reel 34 arranged in the reel placement portion 11 can be more easily replaced.

According to this embodiment, as described above, the second reel placement portion 112 is configured to be movable with respect to the first reel placement portion 111 along a plane perpendicular to the rotation axis directions of the reels 34. Accordingly, the reel is moved along the plane perpendicular to the rotation axis directions of the reels 34 such that the reel 34 can be replaced, and thus it is not necessary to move the reel placement portion 11 or the rotation shaft in the rotation axis directions of the reels 34. Thus, the reels 34 can be easily moved even when the reels 34 are adjacent to each other in the rotation axis directions.

According to this embodiment, as described above, the second reel placement portion 112 is configured to rotate downward (in the Z2 direction) with respect to the first reel placement portion 111 such that the distance between the tape feeder 12 and the support 1122 (1122*a*) is increased. Accordingly, unlike a case in which the second reel placement portion 112 is moved in the horizontal direction away from the tape feeder 12, a movement range in the horizontal direction can be reduced, and thus an increase in a space ensured for the component supply device 10 can be significantly reduced or prevented.

According to this embodiment, as described above, the second reel placement portion 112 is configured to move in the direction away from the tape feeder 12 along the horizontal direction with respect to the first reel placement portion 111 and rotate downward with respect to the first reel placement portion 111 such that the distance between the tape feeder 12 and the support 1122 (1122*a*) is increased. Accordingly, the second reel placement portion 112 is moved in combination with the horizontal and downward rotational movement such that the distance between the tape feeder 12 and the support 1122 (1122*a*) can be effectively increased. Furthermore, the second reel placement portion 112 is spaced apart from the tape feeder 12 such that the component supply tape 33 can be pulled out from the reel 34. Thus, the component supply tape 33 can be loosened when the reel 34 is moved, and thus the reel 34 can be moved more easily.

According to this embodiment, as described above, the reel 34 arranged in the first reel placement portion 111 can pass under the support 1122 (1122*a*) of the second reel placement portion 112 and be taken out from the first reel placement portion 111. Accordingly, the reel 34 arranged in the first reel placement portion 111 and supplying the component supply tape 33 in advance can be taken out from below the second reel placement portion 112, and thus the reel 34 of the first reel placement portion 111 can be taken out without interfering with the reel 34 of the second reel placement portion 112.

According to this embodiment, as described above, the first reel placement portion 111 is configured to not change its position with respect to the tape feeder 12 when the component supply tape 33 is supplied from the reel 34 to the tape feeder 12. Accordingly, it is not necessary to provide a mechanism configured to move the first reel placement portion 111 when the component supply tape 33 is supplied, and thus a complex structure of the reel placement portion 11 can be significantly reduced or prevented.

According to this embodiment, as described above, the outer peripheral portion of the reel 34 arranged in the first reel placement portion 111 is supported by the supports 132 provided on the reel holder 131 of the trolley 13. Accordingly, using the supports 132 provided on the reel holder 131 of the trolley 13, the outer peripheral portion of the reel 34 of the first reel placement portion 111 can be supported, and thus it is not necessary to separately provide a member configured to support the outer peripheral portion of the reel 34 in the first reel placement portion 111.

According to this embodiment, as described above, the first reel placement portion 111 of the reel placement portion 11 is configured to be supported by the supports 132 of the trolley 13, and the second reel placement portion 112 of the reel placement portion 11 is configured to be movably supported by the first reel placement portion 111. Accordingly, using the supports 132 provided on the reel holder 131 of the trolley 13, the first reel placement portion 111 and the second reel placement portion 112 can be supported, and thus it is not necessary to separately provide a member configured to support the first reel placement portion 111.

According to this embodiment, as described above, the first reel placement portion 111 includes the pair of first plate-shaped members 1111 that face each other in the rotation axis directions (X direction) of the reels 34, and the second reel placement portion 112 includes the pair of second plate-shaped members 1121 that face each other in the rotation axis directions of the reels 34. Furthermore, the pair of second plate-shaped members 1121 are configured to hold the supports 1122 therebetween, and to be movable with respect to the pair of first plate-shaped members 1111 along a direction in which the first plate-shaped members 1111 extend. Accordingly, the reels 34 can be held by the first reel placement portion 111 and the second reel placement portion 112 while the pair of first plate-shaped members 1111 and the pair of second plate-shaped members 1121 partition the reels 34 adjacent to each other in the rotation axis directions (X direction). Furthermore, the second plate-shaped members 1121 can be slid along the first plate-shaped members 1111, and thus the second reel placement portion 112 can be easily moved in the direction in which the first plate-shaped members 1111 extend.

According to this embodiment, as described above, the reel placement portion 11 includes guide side walls capable of guiding the reels 34 continuously from the second reel placement portion 112 to the first reel placement portion 111 in a state in which the second reel placement portion 112 is located at a position at which the distance between the support 1122 (1122a) and the tape feeder 12 is equal to or more than the diameter of each of the reels 34, and defined by the pair of second plate-shaped members 1121 and the pair of first plate-shaped members 1111. Accordingly, when the reel 34 is moved from the second reel placement portion 112 to the first reel placement portion 111, a state in which the reel 34 is sandwiched between the pair of the second plate-shaped members 1121 and the pair of the first plate-shaped members 1111 can be maintained, and thus the reel 34 can be more easily moved from the second reel placement portion 112 to the first reel placement portion 111.

According to this embodiment, as described above, at least one of the pair of first plate-shaped members 1111 includes the guide 1112 that guides movement of the pair of second plate-shaped members 1121 with respect to the pair of first plate-shaped members 1111. Furthermore, the pair of second plate-shaped members 1121 are configured to be movable along the guide 1112. Accordingly, the second plate-shaped members 1121 can be easily moved along the guide 1112 of the first plate-shaped members 1111.

According to this embodiment, as described above, the guide 1112 includes the elongated hole provided in the first plate-shaped member 1111. Accordingly, a region in which the second plate-shaped members 1121 can be moved can be defined along the elongated hole, and thus movement of the second plate-shaped members 1121 to a position outside a predetermined range can be significantly reduced or prevented.

According to this embodiment, as described above, the second reel placement portion 112 is configured to be horizontally movable and rotatable with respect to the first reel placement portion 111 due to at least two guided members 1123 being guided with respect to the guide 1112. Accordingly, the second reel placement portion 112 can be stably supported by two or more guided members 1123. Furthermore, when the second reel placement portion 112 is rotated, one of the guided members 1123 is guided with the other of the guided members 1123 as a fulcrum such that the second reel placement portion 112 can be easily rotated.

According to this embodiment, as described above, the pair of second plate-shaped members 1121 are configured such that the distance between the ends thereof farther from the tape feeder 12 is larger than the distance between the ends thereof closer to the tape feeder 12. Accordingly, the reel 34 can be easily inserted from the side farther from the tape feeder 12, and thus the reel 34 can be easily arranged in the second reel placement portion 112.

According to this embodiment, as described above, the pair of second plate-shaped members 1121 are arranged inside the pair of first plate-shaped members 1111. Accordingly, the movable second plate-shaped members 1121 can be arranged inside the first plate-shaped members 1111, and thus interference of another member adjacent in the rotation axis directions of the reels 34 with movement of the second plate-shaped members 1121 can be significantly reduced or prevented.

According to this embodiment, as described above, the second plate-shaped members 1121 each have a thickness smaller than that of each of the first plate-shaped members 1111. Accordingly, an increase in the width of the second reel placement portion 112 in the rotation axis directions of the reels 34 can be significantly reduced or prevented. Furthermore, the second plate-shaped members 1121 can be easily warped and deformed, and thus the second plate-shaped members 1121 are warped such that the distance between the pair of second plate-shaped members 1121 is increased. Thus, the reel 34 can be easily arranged in the second reel placement portion 112.

According to this embodiment, as described above, the reel placement portion 11 is configured to be attachable to and detachable from the reel holder 131 provided in the trolley 13 on which the tape feeder 12 is arranged and configured to hold the reel 34. Accordingly, when the reel placement portion 11 is not used, the component supply device 10 can be used in a state in which the reel placement portion 11 has been detached. Therefore, the arrangement region of the component supply device 10 can be reduced by an amount corresponding to the detached reel placement portion 11.

According to this embodiment, as described above, the first reel placement portion 111 and the second reel placement portion 112 are arranged at the positions offset from the component supply position 32 of the tape feeder 12 in a plan view (as viewed in the Z direction). Accordingly, a region below the component supply position 32 can be left open, and thus a space for storing the used component supply tape 33 and a space for another thing such as a space for the component mounting device 100 can be ensured.

Modified Examples

The embodiment disclosed this time must be considered as illustrative in all points and not restrictive. The scope of the present disclosure is not shown by the above description of the embodiment but by the scope of claims for patent, and all modifications (modified examples) within the meaning and scope equivalent to the scope of claims for patent are further included.

For example, while the example in which the reel placement portion is attached to the trolley (feeder placement portion) has been shown in the aforementioned embodiment, the present disclosure is not restricted to this. In the present disclosure, the reel placement portion may be attached directly to the feeder.

While the example in which the reel placement portion is configured to be attachable and detachable has been shown in the aforementioned embodiment, the present disclosure is not restricted to this. In the present disclosure, the reel placement portion may be fixedly provided.

While the example in which both of the pair of first plate-shaped members include the guides configured to guide the second plate-shaped members has been shown in the aforementioned embodiment, the present disclosure is not restricted to this. In the present disclosure, only one of the pair of first plate-shaped members may include a guide.

While the example in which two reels can be arranged in the reel placement portion has been shown in the aforementioned embodiment, the present disclosure is not restricted to this. In the present disclosure, three or more reels may be arranged in the reel placement portion.

In the present disclosure, the first support may be moved with respect to the second reel placement portion.

In the present disclosure, as the structure of the tape feeder, instead of a mechanism configured to drop the preceding tape down and fit the subsequent tape to the insertion-side sprocket, a mechanism configured to place the preceding tape on the insertion-side sprocket, fit the feed hole of the tape to the teeth of the sprocket from above, rotate the sprocket to feed the tape downstream, place the subsequent tape on the preceding tape in an overlapping manner in a state in which the subsequent tape is not fitted to the teeth of the sprocket for standby, cause the downstream supply sprocket to continuously feed the preceding tape, fit the subsequent tape to the insertion-side sprocket when the preceding tape is no longer fitted to the insertion-side sprocket, and drive the insertion-side sprocket to perform automatic loading may be provided. Even in such a case, a reel placement portion similar to the structure shown in FIG. 3 can be used to move a reel for presetting of a subsequent tape after automatic loading of a preceding tape.

What is claimed is:

1. A component supply device comprising:
    a reel placement portion configured to support a plurality of reels each on which a component supply tape that has held components to be mounted on a substrate is wound; and
    a feeder configured to feed, toward a component supply position, the component supply tape of each of the reels placed on the reel placement portion; wherein
    the reel placement portion includes a first reel placement portion configured to allow a reel that first supplies the component supply tape to the feeder among the plurality of reels to be arranged therein, and a second reel placement portion including a first support configured to support an outer peripheral portion of a reel that supplies the component supply tape to the feeder subsequent to the reel arranged in the first reel placement portion among the plurality of reels;
    the second reel placement portion is configured to change a position of the first support with respect to the feeder so as to change a distance between the feeder and the first support; and
    the second reel placement portion is configured to be movable, with respect to the feeder, to a first position at which the distance between the first support and the feeder is equal to or more than a diameter of each of the reels and to a second position at which the distance between the first support and the feeder is less than the diameter of each of the reels.

2. The component supply device according to claim 1, wherein the reel arranged in the second reel placement portion is configured to be movable to the first reel placement portion by passing through between the first support and the feeder in a state in which the component supply tape is supplied to the feeder and in a state in which the second reel placement portion is arranged at the first position.

3. The component supply device according to claim 1, configured such that the reel arranged in the first reel placement portion passes under the first support of the second reel placement portion and is taken out from the first reel placement portion.

4. The component supply device according to claim 1, wherein the first reel placement portion is configured to not change its position with respect to the feeder when the component supply tape is supplied from the reel to the feeder.

5. The component supply device according to claim 1, wherein
    the first reel placement portion is arranged on a reel holder provided in a feeder placement portion configured to allow the feeder to be arranged thereon, the reel holder being configured to hold the reel; and
    the reel arranged in the first reel placement portion has an outer peripheral portion supported by a second support provided on the reel holder of the feeder placement portion.

6. The component supply device according to claim 5, wherein
    the first reel placement portion of the reel placement portion is configured to be supported by the second support of the reel placement portion; and
    the second reel placement portion of the reel placement portion is configured to be movably supported by the first reel placement portion.

7. The component supply device according to claim 1, wherein the reel placement portion is configured to be attachable to and detachable from a reel holder provided in a feeder placement portion configured to allow the feeder to be arranged thereon, the reel holder being configured to hold the reel.

8. The component supply device according to claim 1, wherein the first reel placement portion and the second reel placement portion are arranged at positions offset from the component supply position of the feeder in a plan view.

9. A component supply device comprising:
    a reel placement portion configured to support a plurality of reels each on which a component supply tape that has held components to be mounted on a substrate is wound; and
    a feeder configured to feed, toward a component supply position, the component supply tape of each of the reels placed on the reel placement portion; wherein
    the reel placement portion includes a first reel placement portion configured to allow a reel that first supplies the component supply tape to the feeder among the plurality of reels to be arranged therein, and a second reel placement portion including a first support configured to support an outer peripheral portion of a reel that supplies the component supply tape to the feeder subsequent to the reel arranged in the first reel placement portion among the plurality of reels;

the second reel placement portion is configured to change a position of the first support with respect to the feeder so as to change a distance between the feeder and the first support; and the second reel placement portion is configured to be movable with respect to the first reel placement portion along a plane perpendicular to rotation axis directions of the reels.

10. The component supply device according to claim 9, wherein the second reel placement portion is configured to rotate downward with respect to the first reel placement portion such that the distance between the feeder and the first support is increased.

11. The component supply device according to claim 10, wherein the second reel placement portion is configured to move in a direction away from the feeder along a horizontal direction with respect to the first reel placement portion and rotate downward with respect to the first reel placement portion such that the distance between the feeder and the first support is increased.

12. A component supply device comprising:
a reel placement portion configured to support a plurality of reels each on which a component supply tape that has held components to be mounted on a substrate is wound; and a feeder configured to feed, toward a component supply position, the component supply tape of each of the reels placed on the reel placement portion; wherein the reel placement portion includes a first reel placement portion configured to allow a reel that first supplies the component supply tape to the feeder among the plurality of reels to be arranged therein, and a second reel placement portion including a first support configured to support an outer peripheral portion of a reel that supplies the component supply tape to the feeder subsequent to the reel arranged in the first reel placement portion among the plurality of reels;

the second reel placement portion is configured to change a position of the first support with respect to the feeder so as to change a distance between the feeder and the first support;

the first reel placement portion includes a pair of first plate-shaped members that face each other in rotation axis directions of the reels;

the second reel placement portion includes a pair of second plate-shaped members that face each other in the rotation axis directions of the reels; and the pair of second plate-shaped members are configured to hold the first support therebetween, and to be movable with respect to the pair of first plate-shaped members along a direction in which the first plate-shaped members extend.

13. The component supply device according to claim 12, wherein the reel placement portion includes guide side walls capable of guiding the reels continuously from the second reel placement portion to the first reel placement portion in a state in which the second reel placement portion is located at a position at which the distance between the first support and the feeder is equal to or more than a diameter of each of the reels, the guide side walls being defined by the pair of second plate-shaped members and the pair of first plate-shaped members.

14. The component supply device according to claim 12, wherein
at least one of the pair of first plate-shaped members includes a guide configured to guide movement of the pair of second plate-shaped members with respect to the pair of first plate-shaped members; and the pair of second plate-shaped members are configured to be movable along the guide.

15. The component supply device according to claim 14, wherein the guide includes an elongated hole provided in the first plate-shaped member.

16. The component supply device according to claim 14, wherein the second reel placement portion is configured to be horizontally movable and rotatable with respect to the first reel placement portion due to at least two guided members being guided with respect to the guide.

17. The component supply device according to claim 12, wherein the pair of second plate-shaped members are configured such that a distance between ends thereof farther from the feeder is larger than a distance between ends thereof closer to the feeder.

18. The component supply device according to claim 12, wherein the pair of second plate-shaped members are arranged inside the pair of first plate-shaped members.

19. The component supply device according to claim 12, wherein the second plate-shaped members each have a thickness smaller than that of each of the first plate-shaped members.

* * * * *